(12) United States Patent
Platzgummer et al.

(10) Patent No.: US 11,569,064 B2
(45) Date of Patent: Jan. 31, 2023

(54) METHOD FOR IRRADIATING A TARGET USING RESTRICTED PLACEMENT GRIDS

(71) Applicant: IMS Nanofabrication GmbH, Vienna (AT)

(72) Inventors: Elmar Platzgummer, Vienna (AT); Christoph Spengler, Vienna (AT); Wolf Naetar, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 462 days.

(21) Appl. No.: 16/133,578

(22) Filed: Sep. 17, 2018

(65) Prior Publication Data

US 2019/0088448 A1 Mar. 21, 2019

Related U.S. Application Data

(60) Provisional application No. 62/559,852, filed on Sep. 18, 2017.

(51) Int. Cl.
*H01J 37/317* (2006.01)
*H01J 37/302* (2006.01)

(52) U.S. Cl.
CPC ...... *H01J 37/3177* (2013.01); *H01J 37/3026* (2013.01); *H01J 37/3175* (2013.01);
(Continued)

(58) Field of Classification Search
None
See application file for complete search history.

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
EP 0178156 A2 4/1986
(Continued)

OTHER PUBLICATIONS

Extended European Search Report for European Application No. 18150797.1, Search completed Jun. 29, 2018, dated Jul. 9, 2018, 8 Pgs.
(Continued)

*Primary Examiner* — Andrew Smyth
(74) *Attorney, Agent, or Firm* — KPPB LLP

(57) ABSTRACT

A method for irradiating a target with a beam of energetic electrically charged particles, wherein the target comprises an exposure region where an exposure by said beam is to be performed, and the exposure of a desired pattern is done employing a multitude of exposure positions on the target. Each exposure position represents the location of one of a multitude of exposure spots of uniform size and shape, with each exposure spot covering at least one pattern pixel of the desired pattern. The exposure positions are located within a number of mutually separate cluster areas which are defined at respective fixed locations on the target. In each cluster area the exposure position are within a given neighboring distance to a next neighboring exposure position, while the cluster areas are separated from each other by spaces free of exposure positions, which space has a width, which is at least the double of the neighboring distance.

22 Claims, 18 Drawing Sheets

(52) U.S. Cl.
CPC ........... *H01J 2237/31754* (2013.01); *H01J 2237/31769* (2013.01)

(56) References Cited

U.S. PATENT DOCUMENTS

| | | | |
|---|---|---|---|
| 1,903,005 | A | 3/1933 | McCuen |
| 2,187,427 | A | 1/1940 | Middleton |
| 2,820,109 | A | 1/1958 | Dewitz |
| 2,920,104 | A | 1/1960 | Brooks et al. |
| 3,949,265 | A | 4/1976 | Holl |
| 4,467,211 | A | 8/1984 | Smith |
| 4,735,881 | A | 4/1988 | Kobayashi et al. |
| 4,899,060 | A | 2/1990 | Lischke |
| 5,103,101 | A | 4/1992 | Neil et al. |
| 5,189,306 | A | 2/1993 | Frei |
| 5,260,579 | A | 11/1993 | Yasuda et al. |
| 5,369,282 | A | 11/1994 | Arai et al. |
| 5,393,987 | A | 2/1995 | Abboud et al. |
| 5,399,872 | A | 3/1995 | Yasuda et al. |
| 5,533,170 | A | 7/1996 | Teitzel et al. |
| 5,814,423 | A | 9/1998 | Maruyama et al. |
| 5,841,145 | A | 11/1998 | Satoh et al. |
| 5,847,959 | A | 12/1998 | Veneklasen et al. |
| 5,857,815 | A | 1/1999 | Bailey et al. |
| 5,866,300 | A | 2/1999 | Satoh et al. |
| 5,876,902 | A | 3/1999 | Veneklasen |
| 5,933,211 | A | 8/1999 | Nakasugi et al. |
| 6,014,200 | A | 1/2000 | Sogard et al. |
| 6,043,496 | A | 3/2000 | Tennant |
| 6,049,085 | A | 4/2000 | Ema |
| 6,107,636 | A | 8/2000 | Muraki |
| 6,111,932 | A | 8/2000 | Dinsmore |
| 6,137,113 | A | 10/2000 | Muraki |
| 6,225,637 | B1 | 5/2001 | Terashima et al. |
| 6,229,595 | B1 | 5/2001 | McKinley |
| 6,252,339 | B1 | 6/2001 | Kendall |
| 6,258,511 | B1 | 7/2001 | Okino et al. |
| 6,280,798 | B1 | 8/2001 | Ring et al. |
| 6,333,138 | B1 | 12/2001 | Higashikawa et al. |
| 6,472,673 | B1 | 10/2002 | Chalupka et al. |
| 6,473,237 | B2 | 10/2002 | Mei |
| 6,552,353 | B1 | 4/2003 | Muraki et al. |
| 6,617,587 | B2 | 9/2003 | Parker |
| 6,768,123 | B2 | 7/2004 | Giering |
| 6,768,125 | B2 | 7/2004 | Platzgummer et al. |
| 6,829,054 | B2 | 12/2004 | Stanke et al. |
| 6,835,937 | B1 | 12/2004 | Muraki et al. |
| 6,858,118 | B2 | 2/2005 | Platzgummer et al. |
| 6,897,454 | B2 | 5/2005 | Sasaki et al. |
| 6,965,153 | B1 | 11/2005 | Ono et al. |
| 7,084,411 | B2 | 8/2006 | Lammer-Pachlinger et al. |
| 7,124,660 | B2 | 10/2006 | Chiang |
| 7,129,024 | B2 | 10/2006 | Ki |
| 7,199,373 | B2 | 4/2007 | Stengl et al. |
| 7,201,213 | B2 | 4/2007 | Leeson |
| 7,214,951 | B2 | 5/2007 | Stengl et al. |
| 7,276,714 | B2 | 10/2007 | Platzgummer et al. |
| 7,367,738 | B2 | 5/2008 | Cleveland |
| 7,368,738 | B2 | 5/2008 | Platzgummer et al. |
| 7,446,601 | B2 | 11/2008 | LeChevalier |
| 7,459,247 | B2 | 12/2008 | Bijnen et al. |
| 7,671,687 | B2 | 3/2010 | LeChevalier |
| 7,683,551 | B2 | 3/2010 | Miyamoto et al. |
| 7,687,783 | B2 | 3/2010 | Platzgummer et al. |
| 7,710,634 | B2 | 5/2010 | Sandstrom |
| 7,714,298 | B2 | 5/2010 | Platzgummer et al. |
| 7,741,620 | B2 | 6/2010 | Doering et al. |
| 7,772,574 | B2 | 8/2010 | Stengl et al. |
| 7,777,201 | B2 | 8/2010 | Fragner et al. |
| 7,781,748 | B2 | 8/2010 | Platzgummer et al. |
| 7,823,081 | B2 | 10/2010 | Sato et al. |
| 8,057,972 | B2 | 11/2011 | Heinrich et al. |
| 8,115,183 | B2 | 2/2012 | Platzgummer et al. |
| 8,178,856 | B2 | 5/2012 | Nakayamada et al. |
| 8,183,543 | B2 | 5/2012 | Platzgummer et al. |
| 8,198,601 | B2 | 6/2012 | Platzgummer et al. |
| 8,222,621 | B2 | 7/2012 | Fragner et al. |
| 8,227,768 | B2 | 7/2012 | Smick et al. |
| 8,257,888 | B2 | 9/2012 | Sczyrba et al. |
| 8,258,488 | B2 | 9/2012 | Platzgummer et al. |
| 8,294,117 | B2 | 10/2012 | Kruit et al. |
| 8,304,749 | B2 | 11/2012 | Platzgummer et al. |
| 8,378,320 | B2 | 2/2013 | Platzgummer |
| 8,502,174 | B2 | 8/2013 | Wieland |
| 8,531,648 | B2 | 9/2013 | Jager et al. |
| 8,546,767 | B2 | 10/2013 | Platzgummer et al. |
| 8,563,942 | B2 | 10/2013 | Platzgummer |
| 8,598,544 | B2 | 12/2013 | Van De Peut et al. |
| 8,736,170 | B1 | 5/2014 | Liu et al. |
| 8,859,983 | B2 | 10/2014 | Wieland |
| 9,053,906 | B2 | 6/2015 | Platzgummer |
| 9,093,201 | B2 | 7/2015 | Platzgummer et al. |
| 9,099,277 | B2 | 8/2015 | Platzgummer |
| 9,184,026 | B2 | 11/2015 | Wieland |
| 9,188,874 | B1 | 11/2015 | Johnson |
| 9,269,543 | B2 | 2/2016 | Reiter et al. |
| 9,335,638 | B2 | 5/2016 | Jager et al. |
| 9,373,482 | B2 | 6/2016 | Platzgummer |
| 9,443,699 | B2 | 9/2016 | Platzgummer et al. |
| 9,495,499 | B2 | 11/2016 | Platzgummer et al. |
| 9,520,268 | B2 | 12/2016 | Platzgummer |
| 9,568,907 | B2 | 2/2017 | Platzgummer et al. |
| 9,653,263 | B2 | 5/2017 | Platzgummer et al. |
| 9,691,589 | B2 | 6/2017 | Van De Peut et al. |
| 9,799,487 | B2 | 10/2017 | Platzgummer |
| 9,978,562 | B2 | 5/2018 | Van De Peut et al. |
| 10,134,565 | B2 | 11/2018 | Matsumoto |
| 10,410,831 | B2 | 9/2019 | Platzgummer |
| 10,522,329 | B2 | 12/2019 | Platzgummer et al. |
| 10,651,010 | B2 | 5/2020 | Platzgummer et al. |
| 10,840,054 | B2 | 11/2020 | Platzgummer et al. |
| 2001/0028038 | A1 | 10/2001 | Hamaguchi et al. |
| 2002/0021426 | A1 | 2/2002 | Mei et al. |
| 2002/0036264 | A1 | 3/2002 | Nakasuji et al. |
| 2002/0148978 | A1 | 10/2002 | Innes et al. |
| 2003/0085360 | A1 | 5/2003 | Parker et al. |
| 2003/0106230 | A1 | 6/2003 | Hennessey |
| 2003/0155534 | A1 | 8/2003 | Platzgummer et al. |
| 2003/0160980 | A1 | 8/2003 | Olsson et al. |
| 2004/0056207 | A1 | 3/2004 | Petrov et al. |
| 2004/0058536 | A1 | 3/2004 | Ki |
| 2004/0119021 | A1 | 6/2004 | Parker et al. |
| 2004/0157407 | A1 | 8/2004 | Qin-Yi et al. |
| 2004/0169147 | A1 | 9/2004 | Ono et al. |
| 2005/0001178 | A1 | 1/2005 | Parker et al. |
| 2005/0063510 | A1 | 3/2005 | Hieronimi et al. |
| 2005/0072941 | A1 | 4/2005 | Tanimoto et al. |
| 2005/0104013 | A1 | 5/2005 | Stengl et al. |
| 2005/0242302 | A1 | 11/2005 | Platzgummer et al. |
| 2005/0242303 | A1 | 11/2005 | Platzgummer |
| 2006/0060775 | A1 | 3/2006 | Sakakibara et al. |
| 2006/0076509 | A1 | 4/2006 | Okino et al. |
| 2006/0169925 | A1 | 8/2006 | Miyajima et al. |
| 2007/0138374 | A1 | 6/2007 | Nishibashi et al. |
| 2007/0178407 | A1 | 8/2007 | Hatakeyama et al. |
| 2007/0279768 | A1 | 12/2007 | Shibazaki et al. |
| 2008/0024745 | A1 | 1/2008 | Baselmans et al. |
| 2008/0080782 | A1 | 4/2008 | Olsson et al. |
| 2008/0099693 | A1 | 5/2008 | Platzgummer et al. |
| 2008/0105827 | A1 | 5/2008 | Tamamushi |
| 2008/0128638 | A1 | 6/2008 | Doering et al. |
| 2008/0142728 | A1 | 6/2008 | Smick et al. |
| 2008/0198352 | A1 | 8/2008 | Kugler et al. |
| 2008/0203317 | A1 | 8/2008 | Platzgummer et al. |
| 2008/0212052 | A1 | 9/2008 | Wagner et al. |
| 2008/0237460 | A1 | 10/2008 | Fragner et al. |
| 2008/0257096 | A1 | 10/2008 | Zhu et al. |
| 2008/0260283 | A1 | 10/2008 | Ivansen |
| 2008/0283767 | A1 | 11/2008 | Platzgummer |
| 2008/0299490 | A1 | 12/2008 | Takekoshi |
| 2009/0032700 | A1 | 2/2009 | Park et al. |
| 2009/0101816 | A1 | 4/2009 | Noji et al. |
| 2009/0168043 | A1 | 7/2009 | Lee |
| 2009/0200495 | A1 | 8/2009 | Platzgummer et al. |

(56) References Cited

U.S. PATENT DOCUMENTS

| | | |
|---|---|---|
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0084219 A1 | 4/2011 | Adamec et al. |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0161511 A1 | 6/2013 | Karimata et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer |
| 2016/0284509 A1* | 9/2016 | Matsumoto ......... H01J 37/3026 |
| 2016/0284513 A1 | 9/2016 | Inoue |
| 2016/0336147 A1 | 11/2016 | Platzgummer |
| 2016/0349626 A1 | 12/2016 | Matsumoto |
| 2017/0032926 A1 | 2/2017 | Miyamoto |
| 2017/0154750 A1 | 6/2017 | Sato |
| 2017/0357153 A1 | 12/2017 | Platzgummer |
| 2018/0019094 A1 | 1/2018 | Iwata |
| 2018/0218879 A1 | 8/2018 | Platzgummer et al. |
| 2019/0066976 A1 | 2/2019 | Platzgummer et al. |
| 2019/0304749 A1 | 10/2019 | Yoshikawa et al. |
| 2020/0348597 A1 | 11/2020 | Hochleitner et al. |

FOREIGN PATENT DOCUMENTS

| | | | |
|---|---|---|---|
| EP | 0928012 | A2 | 7/1999 |
| EP | 1033741 | A2 | 9/2000 |
| EP | 1993118 | A2 | 11/2008 |
| EP | 2019415 | A1 | 1/2009 |
| EP | 2187427 | A2 | 5/2010 |
| EP | 2190003 | A2 | 5/2010 |
| EP | 2214194 | A1 | 8/2010 |
| EP | 2312609 | A1 | 4/2011 |
| EP | 2317535 | A2 | 5/2011 |
| EP | 2363875 | A1 | 9/2011 |
| EP | 2950325 | A1 | 12/2015 |
| EP | 2993684 | A1 | 3/2016 |
| EP | 3037878 | A1 | 6/2016 |
| EP | 3070528 | A1 | 9/2016 |
| EP | 3460824 | A1 | 3/2019 |
| EP | 3460825 | A1 | 3/2019 |
| GB | 2349737 | A | 11/2000 |
| JP | 08213301 | A | 8/1996 |
| JP | 2006019436 | A | 1/2006 |
| JP | 2006332289 | | 12/2006 |
| JP | 2007172862 | A | 7/2007 |
| JP | 2010098275 | A | 4/2010 |
| JP | 2015029096 | A | 2/2015 |
| JP | 2015162513 | A | 9/2015 |
| JP | 2016178300 | A | 10/2016 |
| JP | 2017519356 | A | 7/2017 |
| WO | 2006084298 | A1 | 8/2006 |
| WO | 2008053140 | A1 | 5/2008 |
| WO | 2009147202 | | 12/2009 |
| WO | 2012172913 | A1 | 12/2012 |

OTHER PUBLICATIONS

Extended European Search Report for European Application No. 18154140.0, Search completed Aug. 16, 2018, dated Sep. 4, 2018, 5 Pgs.

European Search Report for Application 08450077.6, report dated Jan. 29, 2010, 2 pgs.

European Search Report for Application 09450211.9-1226; report dated Sep. 14, 2010; 4 pgs.

European Search Report for application 09450212.7; dated Sep. 28, 2010, 9 pgs.

European Search Report for Application 141501197.7, report dated Jun. 6, 2014, 2 pgs.

European Search Report for U.S. Appl. No. 14/165,967, report dated Oct. 30, 2014, 2 pgs.

European Search Report for U.S. Appl. No. 14/165,970, report dated Jun. 18, 2014, 2 pgs.

European Search Report for U.S. Appl. No. 14/170,611, report dated Nov. 4, 2014, 3 pgs.

European Search Report for U.S. Appl. No. 14/176,563, report dated Jan. 14, 2015, 2 pgs.

European Search Report for U.S. Appl. No. 14/177,851; report dated Oct. 16, 2014; 1 page.

European Search Report for U.S. Appl. No. 14/199,183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for U.S. Appl. No. 15/164,770, report dated Sep. 18, 2015; 2 pgs.

European Search Report for U.S. Appl. No. 15/164,772, report dated Sep. 11, 2015, 2 pgs.

European Search Report for U.S. Appl. No. 15/169,632, report dated Oct. 20, 2015, 3 pgs.

European Search Report for U.S. Appl. No. 15/171,348, report dated Oct. 30, 2015, 2 pgs.

European Search Report for EP 14176645, completed Dec. 1, 2014, 1 pg.

European Search Report for EP Application No. 16174185, Search Completed Dec. 6, 2016, 2 pgs.

European Search Report for European Application 10450070.7 dated May 7, 2012, 13 pgs.

European Search Report for European U.S. Appl. No. 16/160,622, Search completed Jul. 21, 2016, dated Jul. 21, 2016, 3 pgs.

European Search Report for European U.S. Appl. No. 16/160,621, Report Completed Oct. 5, 2016, 3 pgs.

(56) References Cited

OTHER PUBLICATIONS

Extended European Search Report for European Application No. 16169216.5, Search completed Sep. 21, 2016, dated Sep. 29, 2016, 12 pgs.

Extended European Search Report for European U.S. Appl. No. 17/153,506, Search completed Oct. 5, 2017, dated Oct. 16, 2017, 2 pgs.

Extended European Search Report for European Application No. 17187922.4, Search completed Feb. 21, 2018, dated Mar. 6, 2018, 7 pgs.

Extended European Search Report for European Application No. 17191553.1, Search completed Mar. 22, 2018, dated Apr. 9, 2018, 5 pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

Berry et al., "Programmable aperture plate for maskless high-throughput nanolithography", J. Vac. Sci. Technol., Nov./Dec. 1997, vol. B15, No. 6, pp. 2382-2386.

Borodovsky, "EUV, EBDW—ARF Replacementor Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pages.

Hinterberger, "Ion optics with electrostatic lenses", University of Bonn, Germany, 2006, 18 pgs.

Huber et al., "Computing Straight Skeletons and Motorcycle Graphs: Theory and Practice", Thesis, Univ. of Salzburg (Austria) Jun. 2011, 134 pgs.

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8.

Kim et al., "Binary-encounter-dipole model for electron-impact ionization", Phys. Rev. A, Nov. 1994, 50, 3954.

Li et al., "Through-Silicon Interposer Technology for Heterogeneous Integration", Future Fab Intl., Issue 45 (Apr. 25, 2013), 6 pgs.

Palfrader et al., "Computing Mitered Offset Curves Based on Straight Skeletons", Computer-Aided Design & Applications, vol. 12, No. 4, Feb. 11, 2015, pp. 414-424.

Paraskevopoulos et al., "Scalable (24-140 Gbps) optical data link, well adapted for future maskless lithography applications", Proc. SPIE vol. 7271, 72711 I (2009), 11 pgs.

Platzgummer et al., "eMET—50keV electron Mask Exposure Tool Development based on proven multi-beam projection technology", Proc. of SPIE, 2010, vol. 7823, pp. 782308-1-782308-12.

Platzgummer et al., "eMET POC: Realization of a proof-of-concept 50 keV electron multibeam Mask Exposure Tool", Proc. of SPIE, 2011, vol. 8166, pp. 816622-1-816622-7.

Shih, "Image processing and mathematical morphology: fundamentals and applications", CRC Press, 2009, pp. 26-32.

Vink et al., "Materials with a high secondary-electron yield for use in plasma displays", Applied Physics Letters, Mar. 25, 2002, vol. 80, No. 12, pp. 2216-2218.

Wheeler et al., "Use of Electron Beams in VLSI", G.E.C.Journal of Science and Technology, General Electric Company. Wembley, Middlesex, GB, vol. 48, No. 2, Jan. 1, 1982, pp. 103-107, XP000820522.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

European Search Report for European Application No. 19172550.6, Search completed Dec. 11, 2019, 1 Pg.

\* cited by examiner

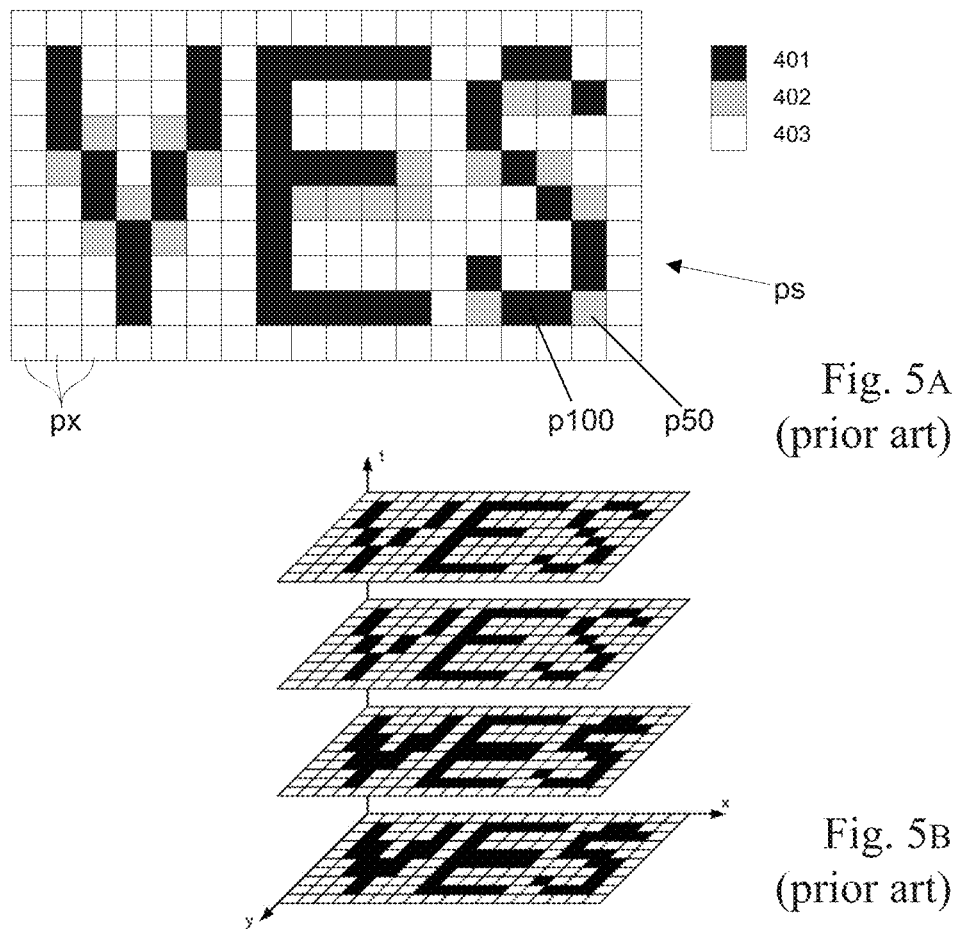
Fig. 5A (prior art)
Fig. 5B (prior art)
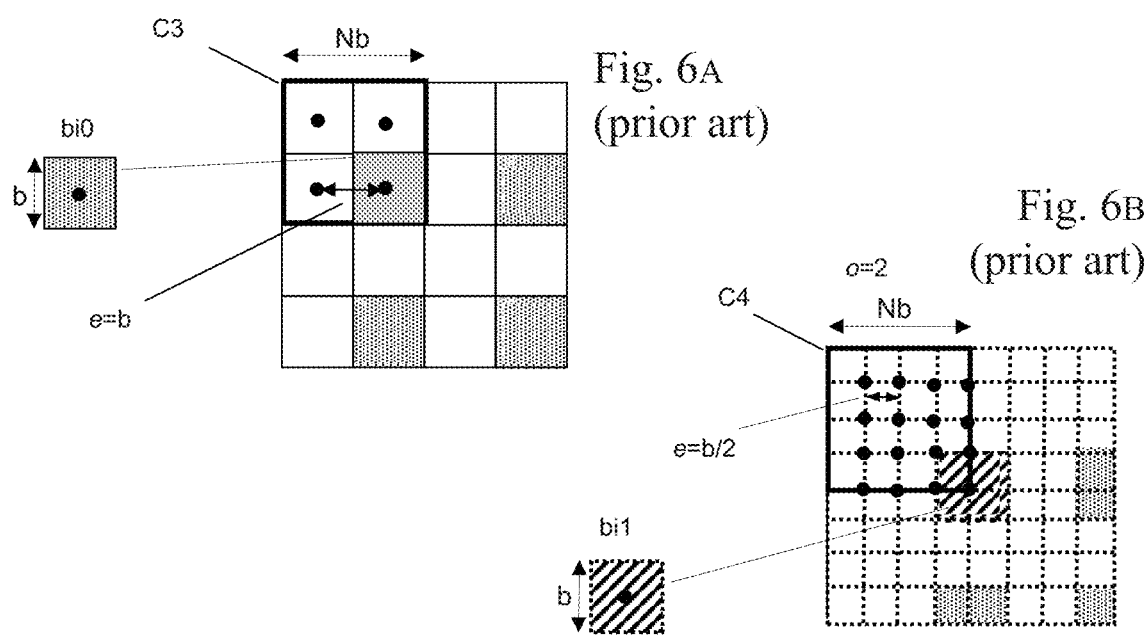
Fig. 6A (prior art)
Fig. 6B (prior art)

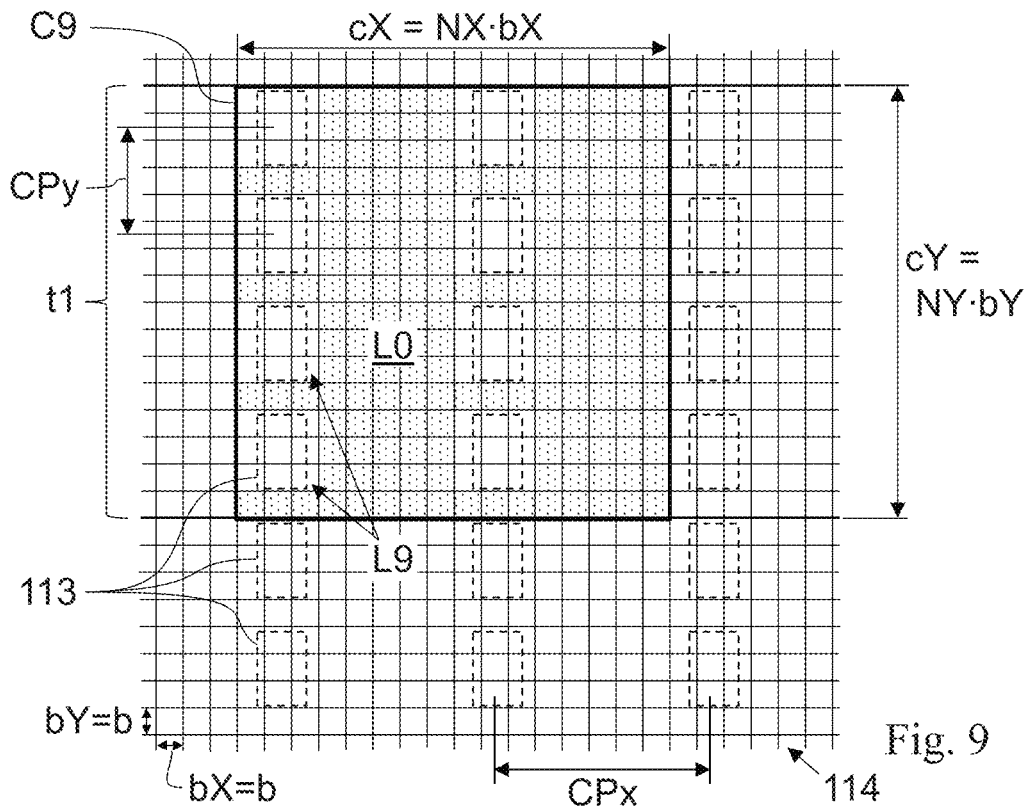
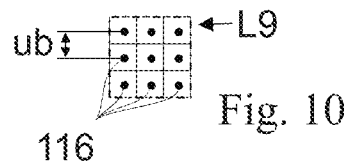
Fig. 10
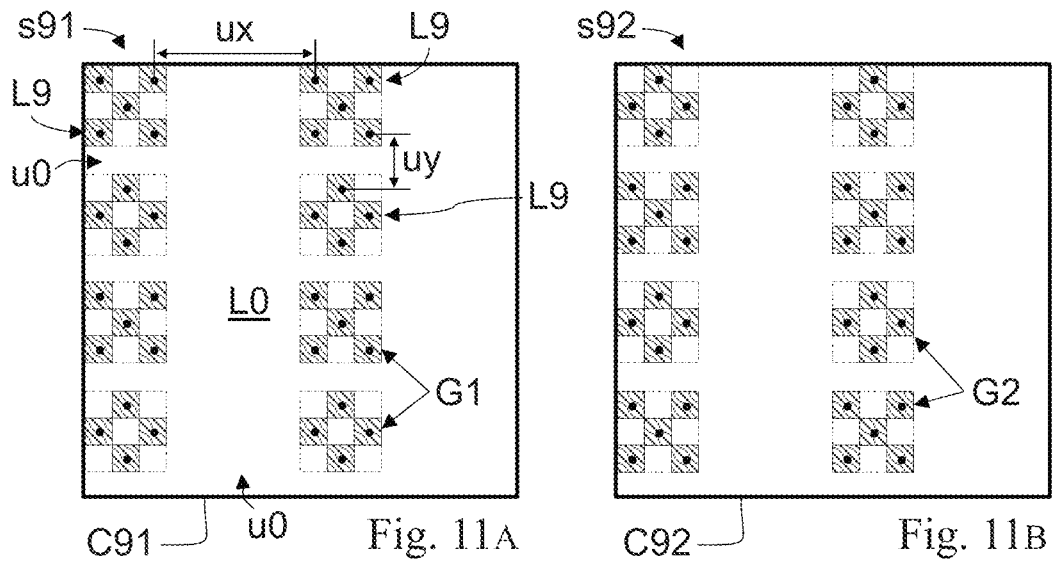
Fig. 11A    Fig. 11B

METHOD FOR IRRADIATING A TARGET USING RESTRICTED PLACEMENT GRIDS

CROSS REFERENCE TO RELATED APPLICATIONS

This application claims priority to U.S. Provisional Application No. 62/559,852 filed on Sep. 18, 2017, the disclosure of which is hereby incorporated by reference in its entirety.

FIELD OF THE INVENTION

The present invention is in the field of lithographic processing methods employing a beam formed of electrically charged particles, in particular electrons or ions. More specifically, the invention relates to a method for irradiating a target with a beam of energetic radiation composed of electrically charged particles, wherein the target comprises an exposure region where an exposure by said beam is to be performed.

BACKGROUND OF THE INVENTION

Methods of the above-described type and charged-particle multi-beam processing apparatuses employing such methods are well-known in prior art. In particular, the applicant has realized charged-particle multi-beam devices as described in several patents in the name of the applicant with respect to the charged-particle optics, pattern definition (PD) device, and multibeam writing methods employed therein. For instance, a 50 keV electron multi-beam writer which allows to realize leading-edge complex photomasks for 193 nm immersion lithograph, of masks for EUV lithography and of templates (1× masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. Multi-beam processing apparatuses of the said kind are hereinafter referred to as multi-beam writer, or short MBW.

SUMMARY OF THE INVENTION

Various embodiments of the invention are directed to lithographic processing methods employing a beam formed of electrically charged particles, in particular electrons or ions. More specifically, the invention relates to a method for irradiating a target with a beam of energetic radiation composed of electrically charged particles, wherein the target comprises an exposure region where an exposure by said beam is to be performed.

In many embodiments the methods for irradiating a target with a beam of energetic radiation composed of electrically charged particles, wherein the target comprises an exposure region where an exposure by said beam is to be performed, the method includes the steps of:
- defining a multitude of pattern pixels located at fixed pixel locations within said exposure region,
- dividing said exposure region into a number of stripes of predefined width,
- defining, for each stripe, a multitude of exposure positions on the target, each exposure position representing the location of one of a multitude of exposure spots, the exposure spots having uniform size and shape and each exposure spot covering at least one pattern pixel,
- providing a pattern definition device having a plurality of apertures transparent to said radiation,
- illuminating said pattern definition device by means of an illuminating wide beam, which traverses the pattern definition device through said apertures thus forming a patterned beam consisting of a corresponding plurality of beamlets,
- forming said patterned beam into a pattern image on the location of the target, said pattern image comprising the images of at least part of the plurality of apertures, which images sequentially expose the exposure spots in accordance with a desired pattern, and
- generating a relative movement between said target and the pattern definition device producing a movement of said pattern image on the target according to a path corresponding to said stripes, wherein the width of the pattern image, taken across the direction of movement is at least the width of the respective stripes,
- wherein defining a multitude of exposure positions is performed with regard to a number of mutually separate cluster areas defined at respective fixed locations on the target, and comprises:
- defining locations of the exposure positions such that each exposure position is within one of the cluster areas, each of said cluster areas comprising a number of exposure positions arranged such that each exposure position is within a given neighboring distance to at least one exposure position of the same cluster area, wherein said neighboring distance is smaller than a size of the images of apertures generated on the target,
- wherein the cluster areas are separated from each other by spaces free of exposure positions, said spaces having a width, which is at least the double of said neighboring distance along at least one direction within the exposure region.

In still many other embodiments a number of stripes is written, each stripe being associated with a subset of grid locations of exposure positions for the cluster areas within the respective stripe, the subsets of different stripes being mutually different and, when taken together, combining to a complete cover of the exposure positions in the cluster areas.

In yet many other embodiments each of the cluster areas comprises at least two sets of exposure positions associated with a respective subset of grid locations, and each of said sets of exposure positions comprises a minimal number of exposure positions, said minimal number being valid for all cluster areas, said minimal number being four, five or more.

In still yet many other embodiments each of said sets of exposure positions, the spatial arrangement of exposure positions of different cluster areas, but associated with the same subset of grid locations, are the same when seen relative to a center position of the respective cluster area.

In still yet many other embodiments each of the cluster areas comprises a number of exposure positions, said number of exposure positions being equal or greater than a minimal number common to all cluster areas, said minimal number being four, five or more.

In still yet many other embodiments the size of each cluster area is larger by at least a factor of 3/2 than the size of the image of apertures as imaged onto the target, with regard to both a direction parallel to said direction of movement and a direction transversal thereto.

In still yet many other embodiments the arrangements of positions within the cluster areas repeat from one cluster area to the next.

In still yet many other embodiments those locations of exposure positions which are exposed simultaneously on the target are arranged according to a two-dimensional grid which directly corresponds to a projected image of a two-dimensional regular arrangement of the apertures in the pattern definition device.

In still yet many other embodiments for each of the cluster areas, and when seen relative to a center position of the respective cluster area, the spatial arrangement of exposure positions is the same for the different cluster areas.

In still yet many other embodiments the set of center positions of the cluster areas is a union of several placement grids as represented by positions of images of apertures on the target.

In still yet many other embodiments the cluster areas are located at predefined positions, said predefined positions forming a regular arrangement on the target in said exposure region, which regular arrangement corresponds to a superset of said two-dimensional grid.

In still yet many other embodiments each stripe contains at least two rows of cluster areas arranged along said main direction.

In still yet many other embodiments within a cluster area the exposure positions are arranged along a regular grid.

In still yet many other embodiments within a cluster area, the exposure positions are arranged to each other at an oblique angle with respect to said direction of movement.

In still yet many other embodiments within a cluster area the set of exposure positions includes a group of exposure positions which are arranged in a defined spatial arrangement, said defined spatial arrangement being designed to produce a predetermined shape each of the group of exposure positions is exposed.

In still yet many other embodiments the cluster areas are arranged along a number of lines, said lines being located at uniform offsets.

In still yet many other embodiments the lines of said number of lines correspond to lines of a line pattern which is pre-formed on the target, and the cluster areas are arranged along said lines at regular intervals.

In still yet many other embodiments said neighboring distance is not greater than the nominal size of images of apertures.

In still yet many other embodiments the exposure positions are selectively exposed at respective exposure doses according to an actual pattern of pattern pixels to be exposed, wherein the position of the exposure positions is independent of the actual pattern.

In still yet many other embodiments uniformly timed exposure steps are used for exposing respective pattern pixels in exposure positions on the target, and during said exposure steps the location of the pattern image is moved along with the target at least with respect to the relative movement along the main direction, and between exposure steps the location of the pattern image is changed with respect to the target, generally compensating the movement of the location of the pattern image with regard to the location of the pattern definition device, wherein the duration of said exposure steps corresponds to a uniform distance of advance along the main direction, said distance of advance being greater than the size of an aperture image within the same partial grid along the main direction.

In still yet many other embodiments the cluster areas are separated from each other by spaces free of exposure positions, along both a direction parallel to said direction of movement and a direction transversal thereto.

In still yet many other embodiments said factor is at least double the size of the image of apertures as imaged onto the target.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure

BRIEF DESCRIPTION OF THE DRAWINGS

In the following, in order to further demonstrate the present invention, illustrative and non-restrictive embodiments are discussed, as shown in the drawings, which schematically show:

FIGS. 5A-B provide an example of a pixel map of an exemplary pattern to be exposed;

FIG. 6A provides an illustration of an arrangement of apertures with M=2, N=2;

FIG. 6B provides an example of oversampling of the pixels in a "double grid" arrangement;

FIG. 9 provides an illustration of the restriction of exposure positions to a set of "patches" with the "complementary lithography" design of FIG. 8B;

FIG. 10 provides an illustration of one patch of FIG. 9;

FIGS. 11A-B provide illustrations of the arrangement of patches within one exposure cell and of placement grids relating thereto;

DETAILED DESCRIPTION OF EMBODIMENTS OF THE INVENTION

Figure 1:
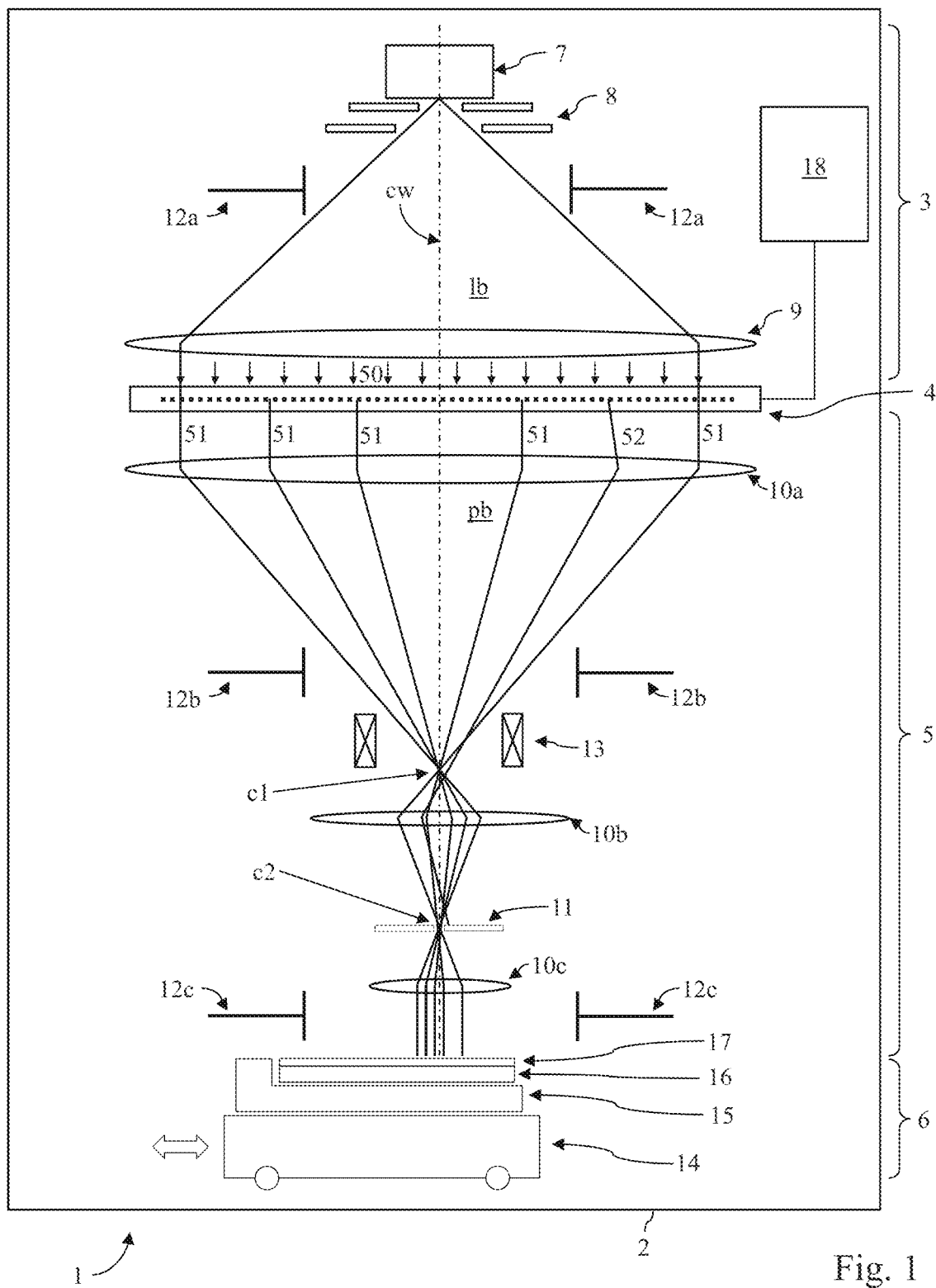
FIG. 1 provides a lithographic system of state of the art in a longitudinal sectional view.

The detailed discussion of exemplary embodiments of the invention given below discloses the basic concepts and further advantageous developments of the invention. It will be evident to the person skilled in the art to freely combine several or all of the embodiments discussed here as deemed suitable for a specific application of the invention; likewise, the appended claims may be freely combined with each other wherever such combination is suitable. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the exemplary embodiments discussed in the following, which are given for illustrative purpose and merely present suitable implementations of the invention.

Turning to the figures and data, lithographic processing methods employing a beam formed of electrically charged particles, in particular electrons or ions are provided. More specifically, the invention relates to a method for irradiating a target with a beam of energetic radiation composed of electrically charged particles, wherein the target comprises an exposure region where an exposure by said beam is to be performed.

As a typical implementation of an MBW, the applicant has realized a 50 keV electron writer tool implementing a total beam size of 20 nm comprising 512×512 (=262,144) programmable beamlets within a beam array field of dimensions 81.92 µm×81.92 µm at the substrate. Further information about this writer tool, which is referred to as "MBMW tool" hereinafter, can be found in U.S. Pat. No. 9,653,263 B2 of the applicant, which is herewith incorporated into this disclosure by reference. In this system the substrate is, typically, a 6" mask blank (having an area of 6"×6"=152.4 mm×152.4 mm and thickness 1"/4=6.35 mm) covered with an electron beam sensitive resist; furthermore, multi-beam writing is possible on resist-covered 150 mm Si wafers as well.

In many applications the structures to be generated on a substrate are limited to a pre-defined set of areas. Examples include complementary lithography (described in more detail below), where a pre-defined line pattern is selectively cut at a restricted set of gridded positions, or the exposure of contact holes, which also commonly lie on a predefined regular grid. In both cases, grid positions which (depending on the actual pattern to be written) may have to be exposed are enclosed by areas which will always be unexposed (independent of the design of the structure to be written). A conventional multibeam exposure strategy, as disclosed e.g. in patents U.S. Pat. No. 9,653,263 B2, 9,053,906, 8,222,621 and 7,276,714 of the applicant will, however, imply that all parts of the target are addressed for possible exposure, where in the case of areas not to be exposed (e.g. off-grid areas) those parts will be addressed with a 0% exposure dose. The applicant has recognized that this potentially leads to an inefficient exposure performance (in particular, waste of exposure time) as well as an overhead of data transfer bandwith (for the rasterized data) and computational resources (for rasterization), arising from the fact that the exposure system is scanning over parts of the substrate which may never carry structures. The applicant has developed a modification for the writing method to allow for an adapted restriction of the writing method to these pre-defined areas, in order to achieve reduced writing duration with the same quality or, alternatively, increased accuracy at the original writing speed.

Therefore, starting from a writing method and a charged-particle exposure tool for performing such writing method, it is an objective of the invention to find a suitable adaptation which allows to reduce the processing time while maintaining the high accuracy of defining the positions of the structures and correcting any positional deviations.

This aim is met by a method as described in the beginning, which is performed with regard to a number of mutually separate cluster areas defined on the target at respective fixed locations, wherein the step of defining a multitude of exposure positions involves defining locations of the exposure positions such that each of the exposure positions is within one of the cluster areas, each of said cluster areas comprising a number of exposure positions; the exposure positions are arranged such that each of them is within a given neighboring distance to at least one other of the same cluster area, wherein the cluster areas are separated from each other by "dormant" spaces, i.e. spaces free of exposure positions, having a width which is at least the double of said neighboring distance, along at least one direction within the exposure region, i.e. within the plane of the target, such as one of the X and Y directions, or both. For instance, the cluster areas may be separated from each other by "dormant" spaces along both a direction parallel to the mentioned direction of movement and a direction transversal thereto.

This solution according to the invention provides takes account of the presence of predetermined regions on the target surface which are the only regions of interest for exposure, a plurality of separate finite areas which are distributed over the surface of the target; and restricting the exposure process (in the relevant processing step) to these predetermined regions. Thus, the remaining part of the target surface is left out from the exposure process. In other words, any exposure (performed during the relevant processing step) is restricted to these "patches" or "cluster areas". This restriction will offer the desired reduction in processing time; however, at the same time, the invention still allows for a fine positioning and correction of position deviations, which may be due to e.g. distortion of the beam field, by adjusting the dose at the nominal exposure positions which belong to the restricted placement grids.

This innovative method is particularly advantageous in the situation where the aperture images on the target are mutually overlapping, or in other words, under the condition that that the neighboring distance is smaller than the size of the images of apertures generated on the target. For different clusters, on the other hand, there is no such overlap—the cluster areas are at a distance to each other such that aperture images of different cluster areas do not overlap at all, and preferably are separated by a finite free space between them.

In a further aspect of the invention, it may be advantageous to perform the writing method by writing a number of stripes, where each stripe is associated with a subset of grid locations of exposure positions for the cluster areas within the respective stripe; in this case it is often advantageous when the subsets pertinent to different stripes are mutually different, but when taken together, combine to a complete cover of the exposure positions which belong to said cluster areas. Preferably each stripe may contain at least two rows of cluster areas arranged along said main direction.

In one preferred embodiment of this aspect, each of the cluster areas comprises at least two sets of exposure positions associated with a respective subset of grid locations, and furthermore each of said sets of exposure positions comprises a minimal number of exposure positions said minimal number being valid for all cluster areas, said minimal number being at least four, preferably five or more; depending on the actual implementation, it could be even higher. A further simplification and reduction of computing time is possible where for each of said sets of exposure positions, the spatial arrangement of exposure positions of different cluster areas but associated with the same subset of grid locations, are the same when seen relative to a center position of the respective cluster area.

More generally, it may be advantageous that each of the cluster areas comprises a number of exposure positions, said number of exposure positions being equal or greater than a minimal number common to all cluster areas, said minimal number being at least four, preferably five or more, and more preferably at least nine.

In a similar aspect, the size of a cluster area will be larger, often considerable larger, than the aperture images used for exposing the cluster areas. Generally, the size of each cluster area may be larger by at least a factor of 3/2, preferably 2, than the size of the image of apertures as imaged onto the target. This will be the case not only with regard to one direction on the place of the target surface, but with regard to both directions, i.e., a direction parallel to the direction of movement and a direction transversal thereto.

Depending on the specific implementation and target type employed, it may be suitable when within a cluster area the exposure positions are arranged along a regular grid. Alternatively or in combination, within a cluster area, the exposure positions may be arranged to each other at an oblique angle with respect to the mentioned direction of movement.

In another development of the invention, which aims at defining structures of specific shape on the target, it may be suitable that within a cluster area, the set of exposure positions includes a group of exposure positions which are arranged in a defined spatial arrangement, said defined spatial arrangement being designed to produce a predetermined shape when each of the group of exposure positions is exposed.

For instance, the cluster areas may be arranged along a number of lines, said lines being located at uniform offsets, said lines preferably corresponding to lines of a line pattern which is pre-formed on the target. In particular, the cluster areas may be arranged along said lines at regular intervals.

As a suitable choice of the mentioned neighboring distance (between next-neighbors within a cluster area), it is preferably not greater than the nominal size of images of apertures.

In a usual case of the invention the pattern pixels, and thus the exposure positions (which cover the pattern pixels), are selectively exposed at respective exposure doses according to an actual pattern to be exposed, wherein the position of the exposure positions is independent of the actual pattern.

In a suitable realization of the tool to employ the method of the invention, during the uniformly timed exposure steps, during which respective pattern pixels are exposed on the target, it may be of advantage to have the location of the pattern image moved along with the target at least with respect to the relative movement along the main direction, wherein between exposure steps the location of the pattern image is changed with respect to the target, generally compensating the movement of the location of the pattern image with regard to the location of the pattern definition device, wherein the duration of said exposure steps corresponds to a uniform distance of advance along the main direction, said distance of advance being greater than the size of an aperture image within the same partial grid along the main direction.

In many embodiments it may impart a simplification of the pre-calculation of the structure data and the datapath, by providing that the locations of exposure positions are such that for those exposure positions which are exposed simultaneously (i.e., within one individual exposure step) the locations of such exposure positions on the target are arranged according to a two-dimensional grid which directly corresponds to a projected image of a two-dimensional regular arrangement of the apertures provided in the pattern definition device. A further simplification is possible where the grid of the cluster areas is compatible with the grid of the beamlets (with respect to the surface on the target); put more exactly, starting from a case where the cluster areas are located at predefined positions, said predefined positions forming a regular arrangement on the target in said exposure region, it may simplify the layout and definition of the cluster areas when this regular arrangement of the cluster area positions corresponds to a superset of the aforementioned two-dimensional placement grid (i.e., of the positions of images of apertures). More specifically, it may be advantageous if the arrangements of positions within the different cluster areas repeat from one cluster area to the next and/or if the set of cluster area centers is a union (or superposition) of several placement grids (positions of images of apertures), which ensures that every aperture can write the same position within a cluster area simultaneously. This situation may be realized by providing that for each of the cluster areas, and when seen relative to a center position of the respective cluster area, the spatial arrangement of exposure positions is the same for the different cluster areas and, if desired or required, by adapting the beamlet and cluster area pitches to be congruent.

Furthermore, it may be advantageous to have the subset of grid locations mutually disjoint with regard to nominal positions of pattern pixels, wherein preferably the grid subsets have a pitch being equal or smaller than the width of the images of apertures on the target, and more preferably equal to the width of the images of apertures on the target times $\frac{1}{2}^{ke}$, with ke being a positive integer, and wherein preferably the regular grid subsets are placement grids employing oversampling with an oversampling factor $o > 1$.

Embodiments of a Lithographic Apparatus

An overview of a lithographic apparatus suitable to employ the preferred embodiment of the invention is shown in FIG. 1. In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. Further details of the data path can be found in U.S. Pat. No. 9,653,263 B2 (section "Datapath") of the applicant.

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 8 or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pb "on" or "off", whereas the former only deal with the particle beam as a whole. There is also the possibility to rotate the ensemble of programmable beams using a solenoid 13 providing an axial magnetic field.

Figure 2:
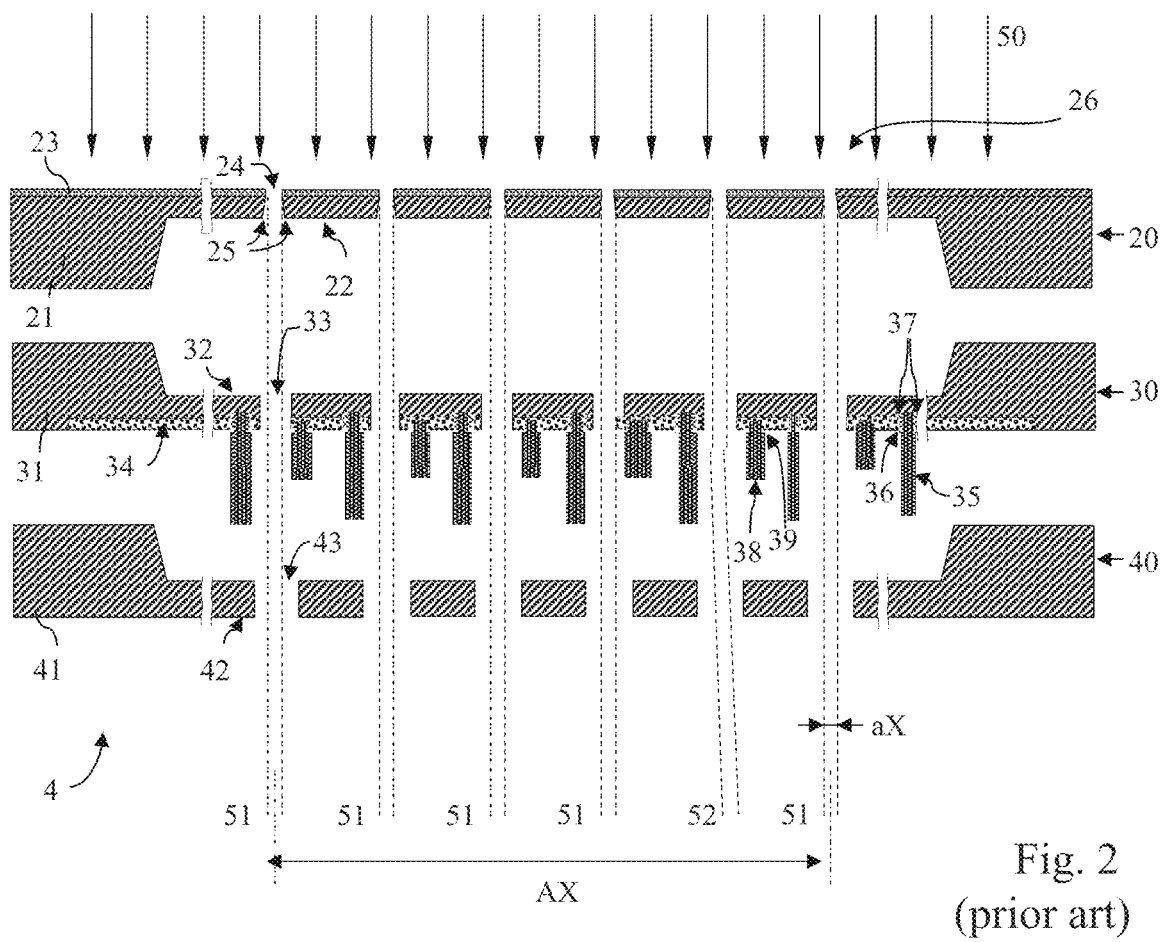
FIG. 2 provides a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (like in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing therethrough (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30. Thus, the size of a single aperture image formed on the target is bX×bY.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 µm×82 µm at the substrate. These examples are stated for illustrative purpose, but are not to be construed as limiting examples.

Embodiments of Writing a Pattern

Figure 3:
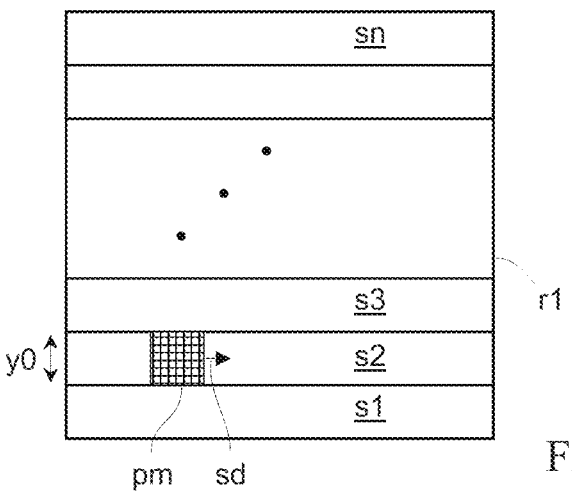
FIG. 3 provides an illustration of the basic writing strategy on the target using stripes.

Referring to FIG. 3, a pattern image pm as defined by the PD system 4 is produced on the target 16. The target surface covered with the charged-particle sensitive resist layer 17 will comprise one or more areas rl to be exposed. Generally, the pattern image pm exposed on the target has a finite size y0 which is usually well smaller than the width of the area rl which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the invention only the relative motion of the pattern image pm on the target is relevant. By virtue of the relative movement the pattern image pm is moved over the area rl so as to form a sequence of stripes s1, s2, s3, . . . sn (exposure stripes) of width y0. The complete set of stripes covers the total area of the substrate surface. The scanning direction sd may be uniform or may alternate from one stripe to the next.

FIG. 5A shows a simple example of an imaged pattern ps with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic application of the invention, the number of pixels of the standard image would be much higher. However, in FIGS. 5A+B the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1) \ldots, i/(n_y-1), \ldots, 1$ with $n_y$ being the number of gray values and i being an integer ("gray index", $0 \le i \le n_y$). Generally, however, the gray values need not be equidistant and form a non-decreasing sequence between 0 and 1.

Figure 4:
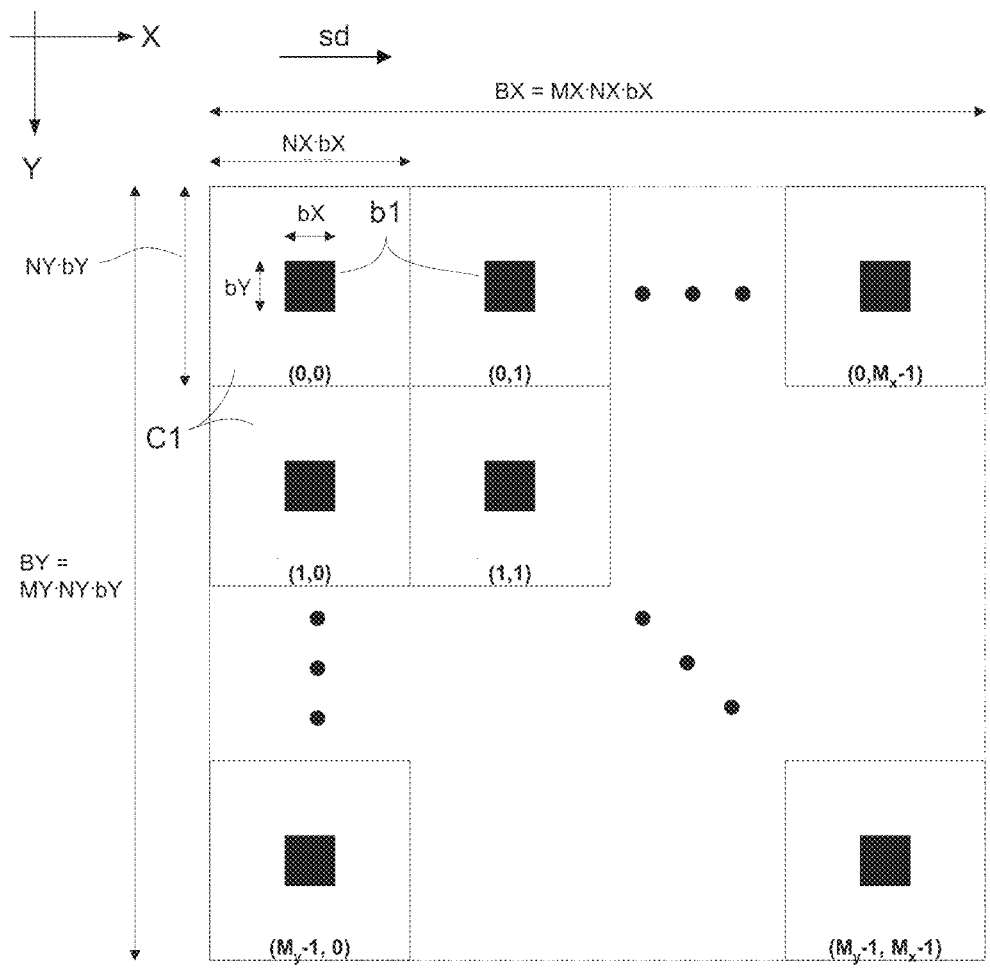
FIG. 4 provides an exemplary arrangement of apertures as imaged onto the target.

FIG. 4 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX·bX and NY·bY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

The pitch between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. Nos. 8,222,621 and 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

FIG. 6B illustrates one example of an oversampling of o=2 combined with placement grids, referred to as "double-grid": namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8. The parameter o may also be assigned a non-integer value greater one, such as $2^{1/2}=1.414$ or $2^{3/2}=2.828$, corresponding to the case of the "Double-Centered Grid" shown in U.S. Pat. No. 9,653,263.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., o>1) consists of up to $o^2$ nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity of the exposure grid, by virtue of aliasing effects. A high number of gray shades allows better feature placement. Therefore increasing the gray levels is of relevance where the gray shades per pixel position are limited to a certain number.

Figure 7A:
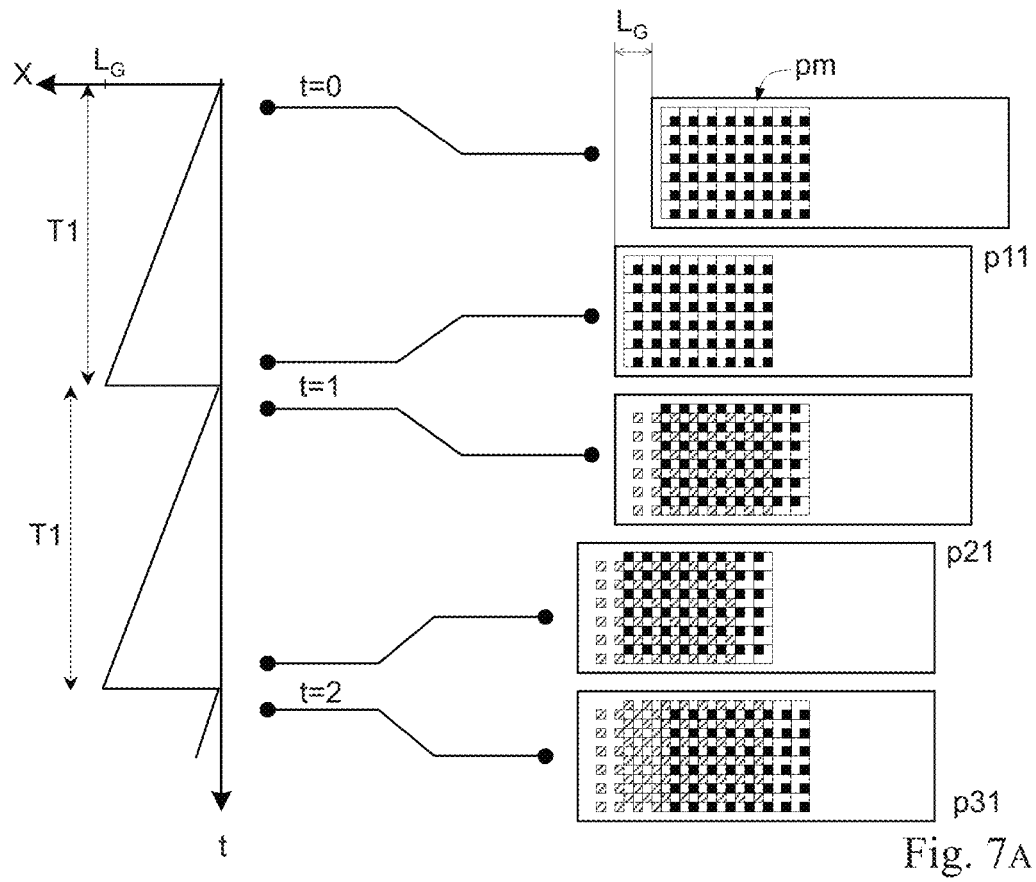
FIG. 7A provides an illustration of the exposure of one stripe.

FIG. 7A shows an exposure scheme of the pixels, which is suitable for the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time $T_1$ for exposure at each placement grid corresponds to a length, which we call "exposure length", given by $L_G = vT_1 = L/p = NMb/p$, where p denotes the number of exposure positions within a cell ($p = No^2$ for a regular oversampled grid).

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

It is remarked that FIG. 7A neglects the time needed for opening/closing the individual apertures according to the actual pattern. In reality the deflecting devices of the DAP and deflection multipole systems need a certain settling time interval $T_S$, to settle the status of the apertures after repositioning and fading out of transient oscillations. The settling time interval $T_S$ is a (very) small fraction of the pixel exposure cycle T1. Therefore, rather than the entire pixel exposure cycle T1, only a usable time Tu=T1−$T_S$ is used for the exposure of pixels. The time interval Tu is the pixel exposure period within which to ensure that the appropriate dose is passed to the respective pixels. In the following, however, it is assumed that $T_S$ is negligible as compared to T1, and no discrimination is made between Tu and T1 hereinafter.

The usable exposure time Tu is divided into g time slots, corresponding to the number of gray shades possible to address. One value for g would be g=16 (4 bit). The pixel exposure is activated according to the desired gray shade, which is the sum of used time slots within Tu. If the dose applied to one pixel within the time Tu is digitized into g gray levels, it is possible to reload a general blanking cell g times during Tu; each blanking cell in the blanking array receives its individual gray shade during the exposure period T1 (or more accurately, the usable time Tu).

Figure 7B:
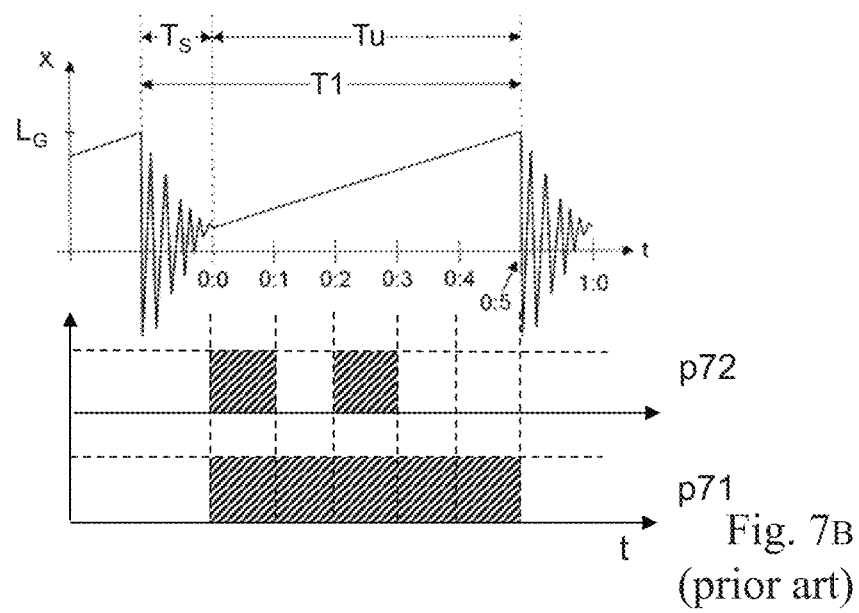
FIG. 7B provides an illustration of the exposure of gray levels.

FIG. 7B illustrates the exposure of two pixels with different gray shades in a simplified example with g=5; the relative size of the settling time interval $T_S$ is greatly exaggerated. In accordance with g=5 there are five time slots in each usable time interval Tu. A first pixel p71 is exposed at a gray shade at 100% (i.e., "black"), and a second pixel p72 at a gray shade of 60%. For pixel p72 two time slots of a corresponding blanking electrode generate a gray shaded pixel; in this example, since 60% corresponds to a gray shade with 2 out of 5, and two of them—in arbitrary order—are set to switched-on. On the other hand, for pixel p71 the respective blanking electrode is activated during all five time slots, thus generating a black pixel with the maximum dose that may be deposited during Tu.

Embodiments of Complementary Lithography

Figure 8A:
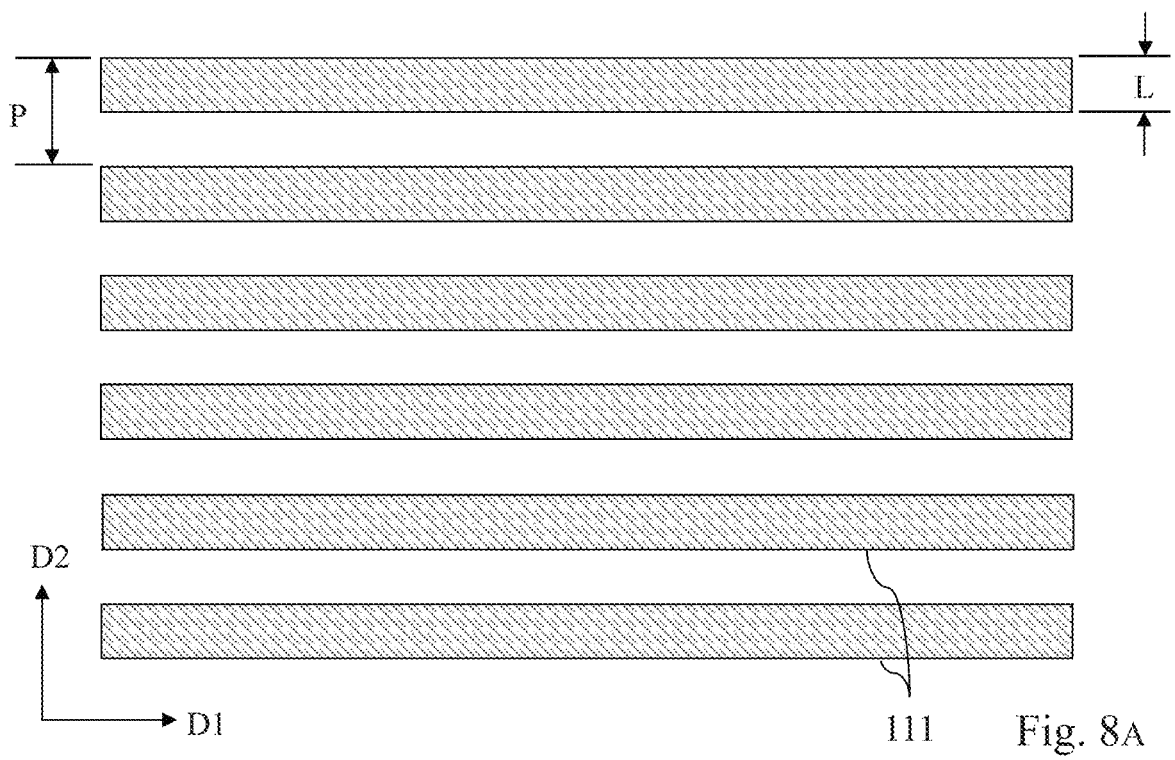
FIGS. 8A-B provide illustrations of an example of a one-dimensional circuit design on which "complementary lithography" is performed.

FIG. 8A shows a one-dimensional design, which represents a typical pre-formed pattern structured on a target suitable for "complementary lithography". For instance, on a suitable target, a regular line pattern 110 is provided, which may be fabricated using 193 nm (water) immersion optical lithography, layer deposition and etching steps. The line pattern 110 comprises a plurality of lines 111 running along a uniform "line grid direction" D1 and having line width L and pitch P. Typical values of L, P are several nm, for instance L=20 nm and P=40 nm with a 10 nm node.

Figure 8B:
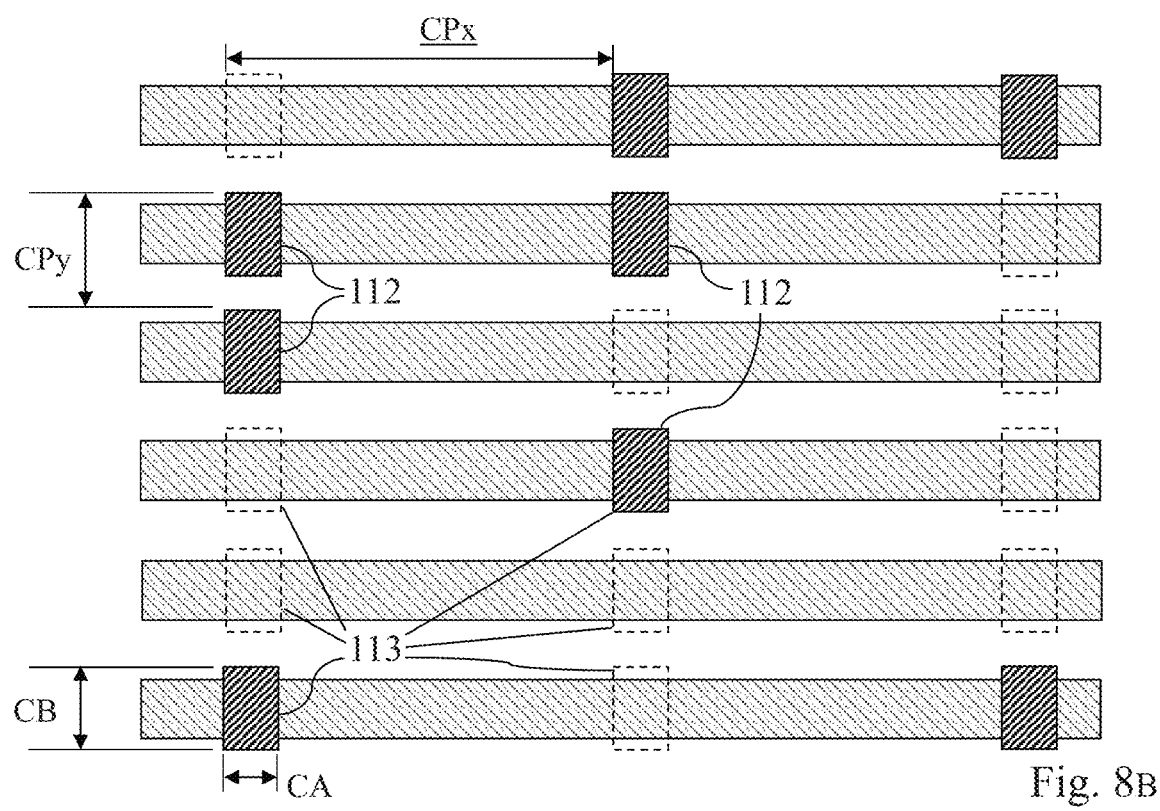

On this target, as illustrated in FIG. 8B, a "complementary lithography" exposure is performed to induce cuts 112 with side lengths CA and CB, indicated by rectangles with darker hatching. These cuts 112, which are oriented along a direction D2—also referred to as "cut direction"—which is oblique or preferably perpendicular to the line grid direction D1, are generated by employing suitable resist exposure and resist development, and subsequent etching steps to accomplish the cuts in the regular line pattern. The cuts 112 will typically lie on a regular grid with basic horizontal and vertical pitches CPx and CPy, which defines a plurality of "cut positions" 113, indicated in FIG. 8B as rectangles (either with hatched filling or with dashed border). In other words, the position offset between two cuts 112 is a multiple of the basic horizontal and vertical pitches CPx and CPy, as seen along the directions D1 and D2, respectively. In some applications, the cut patterns may be sparsely placed across the line pattern in one or both axial directions, so CPx>>CA and/or CPy>>CB. The values of CA, CB are chosen suitably with regard to the dimensions of the quantities L and P, for instance CA=20 nm and CB=24 nm with a 10 nm node.

In the following, various aspects of the invention will be discussed within the context of complementary lithography. It is to be noted, however, that these considerations are also valid in other contexts (e.g. exposure of contact holes) where structures which are placed in a periodic pattern which contain "dormant" free regions between are to be exposed.

Embodiments of Restricting the Exposure

According to a first aspect of the invention the positions of exposure are restricted to certain regions of possible exposure; this is in contrast to the conventional approach which fills the whole exposure cell as shown in FIG. 7A (also see, e.g., U.S. Pat. No. 9,653,263 B2 of the applicant). In particular, with respect to "complementary lithography" exposure, the exposure is restricted to regions corresponding to the cut positions 113. Thus, the exposure procedure takes place only for a fraction of the original target surface, which reduces the processing time and, more importantly, will lead to a decreased amount of data per unit area required for encoding the pattern in the writing process. This is an important advantage, also in view of the observation that the data rate (amount of data transmitted per second, e.g. 120 Gbit/s in writing tools of the state of the art) is often one of the main performance bottlenecks during the exposure process. Thus, the invention will increase writing efficiency and writing speed, resulting in a higher throughput.

FIG. 9 illustrates the principle of the invention in a simple first embodiment of the invention in relation to "complementary lithography" exposure as illustrated in FIGS. 8A+B, for a beamlet arrangement with N=16 and without oversampling of pattern pixels (o=1). FIG. 9 shows the plurality of possible cut positions 113 of the one-dimensional circuit structure on the target surface, onto which a multitude of pattern pixels of dimensions bX×bY=b×b is superimposed according to a regular grid 114. It is evident that only a fraction of the pixels overlap with the areas of the cut positions 113. Furthermore, the dimensions of one exposure cell, indicated as rectangle C9, is shown, having dimensions cX=NX·bX and cY=NY·bY; in this special case cX=cY=N·b=160 nm. During the process of exposure, the exposure cell C9 will be shifted along the X axis of FIG. 9, thus exposing a trace tl along the scanning direction sd (FIG. 3); it is reminded that the exposure cell is only a part of the pattern image pm (FIG. 3), and the sum of the traces of all cells, taken together, will write a stripe (cf. FIG. 7A and pertinent description above).

The depiction in FIG. 9 shows that in the exposure cell C9, the pixels shown with dot hatching will not be exposed at all ("dormant pixels"); only the pixels shown white within the exposure cell C9 are used to expose a cut structure (when and if the respective cut structure is to be exposed according to the actual pattern). In the special example of FIG. 9, there are eight "patches" L9 of 3×3 pixels, and the patches L9 are mutually separated by at least one row or column of "dormant pixels", which together form a contiguous "environs" area L0 surrounding all patches.

In more general terms, the invention provides for defining predetermined regions on the target surface which are candidates for exposure, a plurality of separate finite areas which are distributed over the surface of the target; and restricting the exposure process (in the relevant processing step) to these predetermined regions. Thus, the remaining part of the target surface is left out from the exposure process. In other words, any exposure (performed during the relevant processing step) is restricted to these predetermined candidate regions, in that the exposure is done only within these regions (all of them or only selected ones of them, depending on the instant application). In the context of the present invention, these predetermined regions are referred to as "patches" or "cluster areas"; and the remaining part, which is not exposed, is referred to as "environs". In the case of "complementary lithography" as illustrated in FIGS. 1A and 1B, these separate finite areas are the patches L9 which correspond with the possible locations 113 of the cut rectangles, arranged along a rectangular grid. It will be evident that other applications and/or other processing types may envisage other types of arrangement of the "patches" which form a plurality of separate areas of finite size, arranged along a specific grid which may be of any suitable geometric type in general.

It will be evident to the skilled person that the present invention offers a considerable improvement of performance, by achieving the placement accuracy and writing mode redundancy as with known writing techniques (such as described in U.S. Pat. Nos. 7,777,201 and 8,222,621 of the applicant) while exploiting the sparsity of the restricted target regions, such as the cutting structures in FIG. 8B.

FIG. 10 illustrates one of the patches L9, which comprises, for instance, 3×3 pixels. For each of the pixels, its location is defined by an exposure position, indicated in FIG. 10 as respective dots 116. The exposure positions within the patch L9 are arranged at a distance ub to the exposure position of a respective next-neighbor pixel; in this example ub=b. As can be seen in FIG. 11A, the patches L9 are separated from each other by spaces u0 whose width corresponds to at least one row or column of free (i.e., "dormant") exposure positions. In other words, the patches (cluster areas) L9 are separated from each other by a spacing ux, uy which is at least the double of the next-neighbor distance ub in the patch, with respect to the locations of exposure positions.

Referring to FIGS. 11A and 11B, a suitable implementation of the invention uses partial placement grids, in that the pattern pixels (more exactly, exposure positions) of the patches are associated with different placement grids, which are exposed during different stripe exposures. For instance, during the exposure of a first stripe s91 as illustrated in FIG. 11A, the pattern pixels shown hatched are exposed, and this set of exposure positions corresponds to a first placement grid G1. Later, a second stripe s92 is exposed, which realizes a second placement grid G2, indicated by the hatched pixels in FIG. 11B. Thus, the two stripes together serve to expose the entire set of pattern pixels of the patches L9. In contrast, the pixels of "dormant" exposure positions, which belong to the "environs" area L0, are not written to, and therefore, thy are not exposed at all. The rectangles C91, C92 indicate the positions of the same exposure cell (of same dimensions as in FIG. 9) in relation to the stripes s91, s92, respectively. In this embodiment, the stripes s91, s92 are arranged such that they fully overlap; in other embodiments the stripes may be overlapping by only half of their widths, and then the location of the patches and the corresponding placement grids is adapted accordingly.

Figure 12:
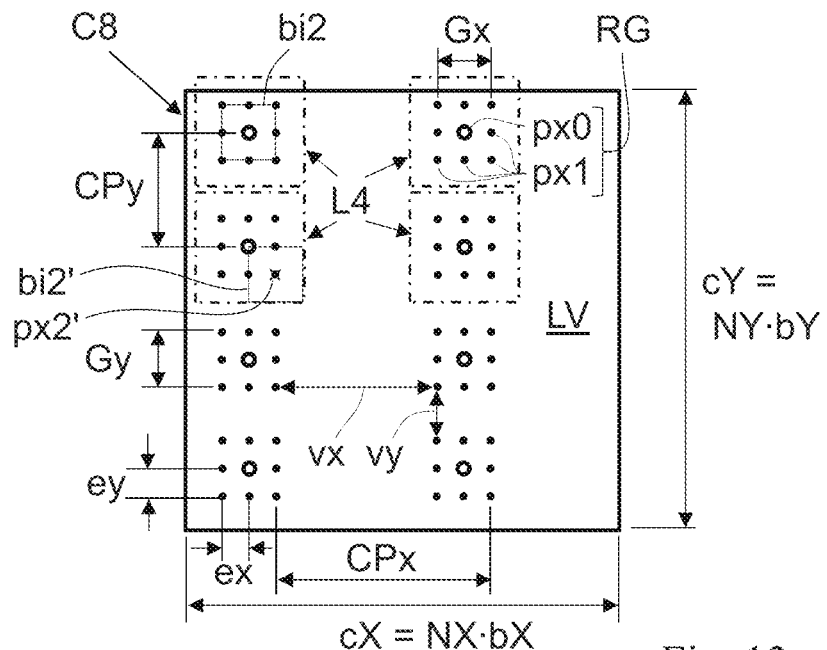
FIG. 12 provides an illustration of another embodiment employing patches.
Figure 13A:
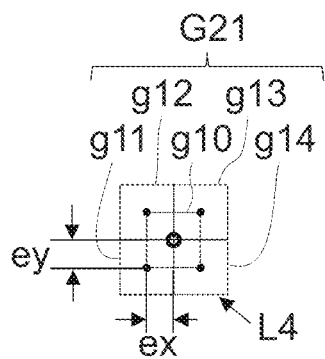
FIGS. 13A-B provide, respectively, one patch of FIG. 12 associated with respectively different placement grids.

FIG. 12 and FIGS. 13A+B illustrate another embodiment of the invention, which relates to an exposure process employing oversampling with o=2 while emulating the basically same unit cell of the "complementary lithography" exposure of FIGS. 8A+B. Specifically, this embodiment is based on a "double-grid" writing mode, as discussed above with FIG. 6B, using an aperture array play plate with beamlet spot size b=20 nm and NX=NY=8, resulting in a beamlet pitch (i.e., positional offset between neighboring beamlets) cX=cY=N·b=160 nm. It is important to note that for o>1 the concepts of pixels and exposure positions do not coincide any more (in contrast to the situation of o=1 as discussed in the previous embodiment), since each one exposure position defines the position of a corresponding exposure spot which covers a number of pixels; namely, in general $o^2$ pixels.

FIG. 12 illustrates the locations of patches L4 and pertinent pattern pixel locations within one exposure cell C8. The dashed rectangle bi2 indicates the size of one instance of a beamlet spot (i.e. aperture image) formed on the target, having size b×b, which is to be seen in relation to the exposure cell C8 of dimensions cX×cY. The dots and small open circles in FIG. 12 (of which some are indicated by reference symbols px0, px1) represent the individual (center) locations of beamlet spots, also referred to as "exposure positions". In accordance with the invention the exposure positions are restricted to one or several separate regions, i.e., "patches" L4, which are separated from each other and embedded in a dormant environs area LV. The dashed rectangle bi2' indicates another example of a beamlet spot position, corresponding to the exposure position denoted by dot with small cross px2'.

Since an oversampling parameter o>1 is used, the positional offset e (also referred to as "placement grid pitch", namely, the positional offset between neighboring exposure positions that a beamlet may take on the target) is smaller than the beamlet spot size b. In this embodiment with oversampling parameter o=2, the positional offset is e=b/o=ex=ey=10 nm. In the embodiment shown, ex=ey, but a modification for ex and ey having different values is straightforward.

The arrangement of FIG. 12 implements a grid of patches L4 arranged according to CPx=80 nm and CPy=40 nm in a regular rectangular grid, where each patch corresponds to a cut position for cuts (and apertures images) of size 20×20 nm. The exposure positions are spread up to Gx=Gy=20 nm in horizontal and vertical directions. Each patch L4 is preferably centered around the center position of a cut position, where a respective center exposure position px0 is located (indicated by a small open circle in FIG. 12), surrounded by a number of additional exposure positions px1. The patches L4 do not overlap in at least one of the two axial directions and are separated by regions where no exposure positions are made ("dormant spaces"); for instance, in the embodiment of FIG. 12, these free regions correspond to columns and rows of "non-used" locations which in a full grid would also be used as exposure positions. These free regions, when taken together, represent the environs area LV.

In each of the patches L4, the pixel locations are arranged at distances ex, ey to each other (as regards next-neighbors). The patches L4 are separated from each other by spaces which correspond to at least one row or column of "dormant" pattern pixels. Thus, the patches L4 are separated from each other by a spacing vx, vy which is at least the double of the next-neighbor distance ex, ey within each patch.

Figure 13B:
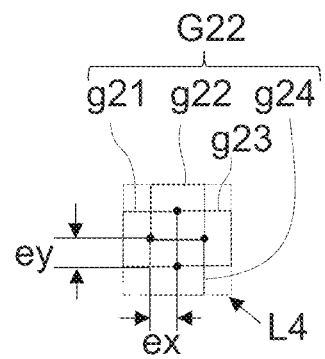

Referring to FIGS. 13A and 13B, the exposure positions px0, px1 of all patches L4 within the cell C8 of FIG. 12A, are exposed according to different placement grids G21, G22. The placement grids relate to the positions assigned to the beamlet image positions formed on the target during the exposure procedure. In agreement with the oversampling o=2 of this embodiment, each patch L4 is exposed by means of a number of beamlet images, each of which covers oxo=2×2=4 pattern pixel locations. For instance, a first placement grid G21 comprises five placement grid locations g10, g11, g12, g13, g14 shown in FIG. 13A, whereas a second placement grid G22 comprises four other placement grid locations g21, . . . , g24 shown in FIG. 13B. For each of the placement grid locations g10-g24 (which are represented by dashed rectangles indicating the areas of the corresponding exposure spots) the corresponding exposure positions are indicated in FIGS. 13A+B by respective dots (for locations g11-g24) or small open circle (for location g10) denoting the center of the respective rectangle. Each of the placement grids G21, G22 is exposed during a different stripe, with the stripes overlapping in a suitable manner; exposure methods based on overlapping stripes are described in U.S. Pat. Nos. 8,222,621 and 9,053,906 of the applicant in more detail. Since the placement grids comprise only positions restricted to the patches (cluster areas), they represent restricted placement grids.

Thus, by virtue of restricting exposure positions to patches L4, which in this example are realized as a Gx=Gy=20 nm square neighborhood around the centers of possible via/cut positions, the restricted placement grid shown in FIG. 12 remains. Compared to the situation of the full grid (FIG. 6B), only a fraction $$S = \frac{Gx/ex+1}{CPx/ex} \cdot \frac{Gy/ey+1}{CPy/ey} = \frac{3}{4} \cdot \frac{3}{8} = \frac{9}{32}$$

of exposure positions remain. Thus, a reduction of data/area by s−1=72% is achieved.

As in a full oversampled grid, the additional exposure positions allow for extra redundancy (the placement errors of overlapping beamlets are averaged). Furthermore, by redistributing the dose among the exposure positions within the patch, placement and size of the cut can be modified, which is useful to correct known placement or scale errors (e.g. due to target deformation or distortion of the projection optics). An illustration of this procedure is given in FIGS. 17A-C. The dose distribution of FIG. 17A, after exposure and development along the 50% dose contour, results in a centered cut (indicated with a solid rectangle) with maximal redundancy. The two distributions of FIGS. 17B+C demonstrate, in the context of FIG. 12A, how a redistribution of dose can be utilized to move the cut within the patch (to the right and lower right, respectively, in FIG. 17B and FIG. 17C). By interpolating between the central position on top and the maximal deviations on the bottom (as disclosed in U.S. Pat. No. 7,276,714), a precise positioning within the patch can be achieved.

Figure 17A:
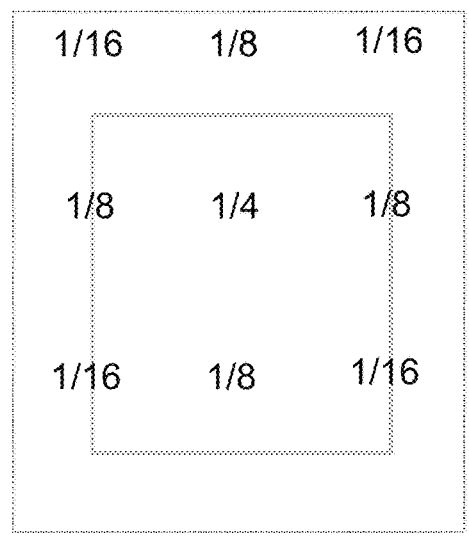
FIGS. 17A-C provide illustrations of how different dose assignments within a patch result in a shift of the exposed structure.
Figure 17B:
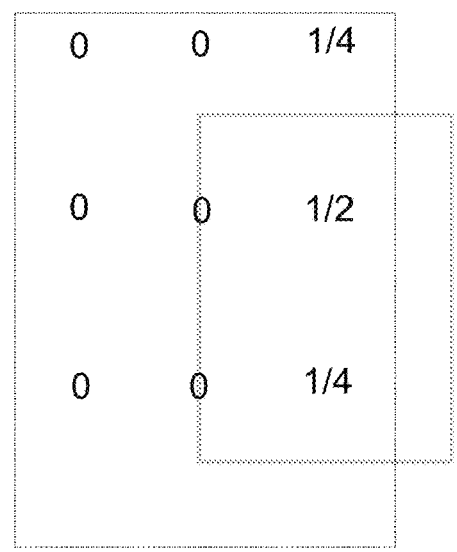
Figure 17C:
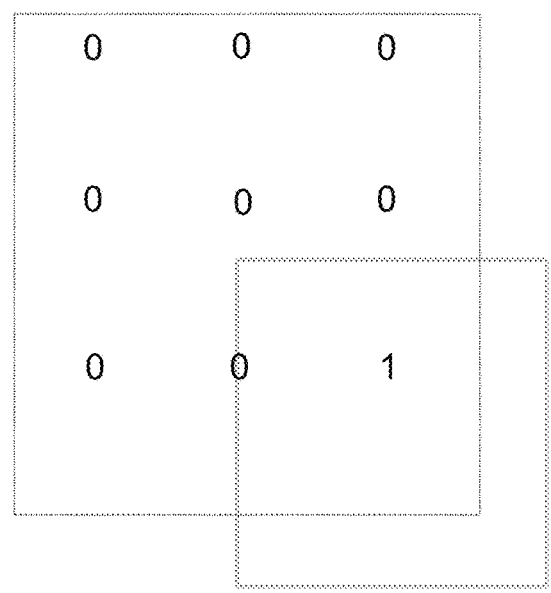

The FIGS. 17A+C demonstrate that the restricted placement grids of the invention still allow for correction of position deviations, which may be due to e.g. distortions across the beam field, by adjusting the dose at the nominal exposure positions which belong to the restricted placement grids. This is possible, in particular, by keeping the exposure positions within the patches in a distance corresponding to an oversampling parameter o>1, which results in an overlap of the beamlet spots on the target. The maximal deviation that can be corrected is given a fraction of the width or height of the respective patch; in the example shown in FIG. 12, Gx/2=Gy/2=10 nm in both coordinate directions.

Figure 18:
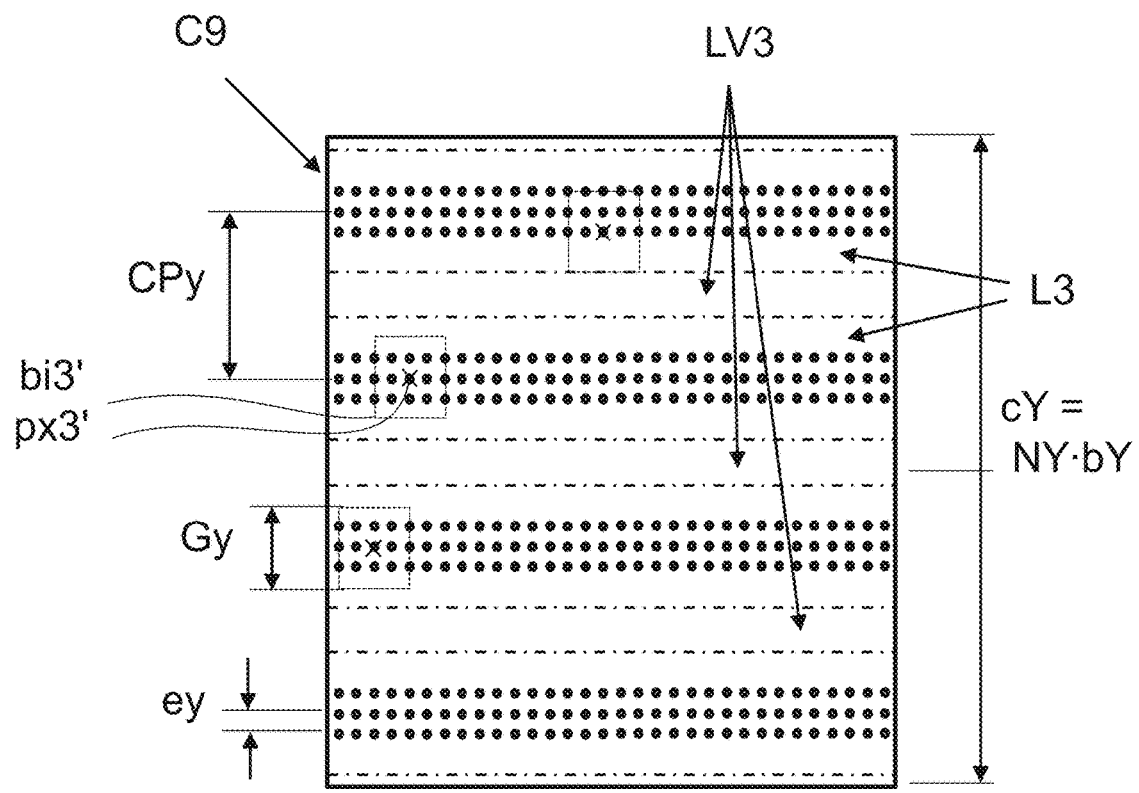
FIG. 18 provides an illustration of yet another embodiment employing patches.

Another example of a cluster configuration is given in the embodiment shown in FIG. 18, again for a 20×20 nm cut/aperture image size. In contrast to FIG. 12, the patches L3 fully overlap in the X direction (horizontal direction in FIG. 18) to allow for arbitrary placement of the cut structures along the X direction, but are separated by stripes of the environs area LV3, providing a separation along the Y direction. The size of a beamlet spot is indicated by dashed rectangles which respectively represent exemplary instances bi3' of a beamlet spot position; the respective exposure position px3' is denoted by a dot with small cross. Here, o=4 and ex=ey=5 nm, i.e. "quad-grid" oversampling is used for higher redundancy and more accurate placement. In vertical direction, positional deviations from the central position (e.g. bi3') up to Gy/2=5 nm can be corrected and the patch distance is given by CPy=40 nm (as in FIG. 12A). In total, 37.5% of exposure positions remain compared to a full "quad-grid".

It is also remarked that the pitch of the aperture images cX, cY may generally be chosen freely, but a suitable choice in the context of "complementary exposure" is such that this pitch is an integer multiple of the via/cut-structure pitches CPx, CPy, in order to obtain a periodicity which is commensurate within the exposure cells. The other parameters Gx, Gy, ex, ey can be chosen freely, so as to achieve a desired redundancy and maximal correctable displacement as required with the specific implementation of the writing process.

Figure 14A:
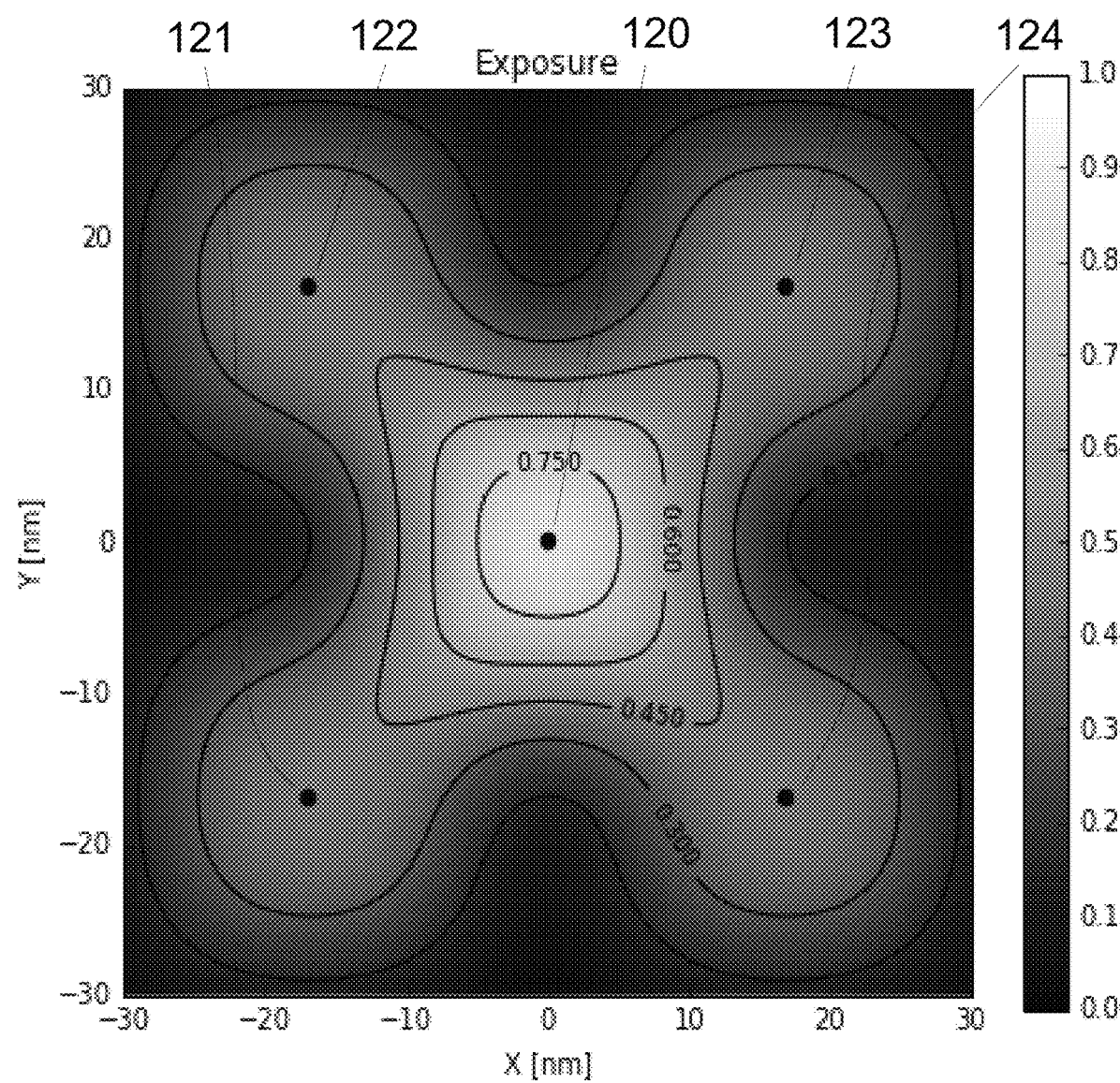
FIGS. 14A-H provide illustrations of various examples of exposure position sets for generating different target shapes.
Figure 14B:
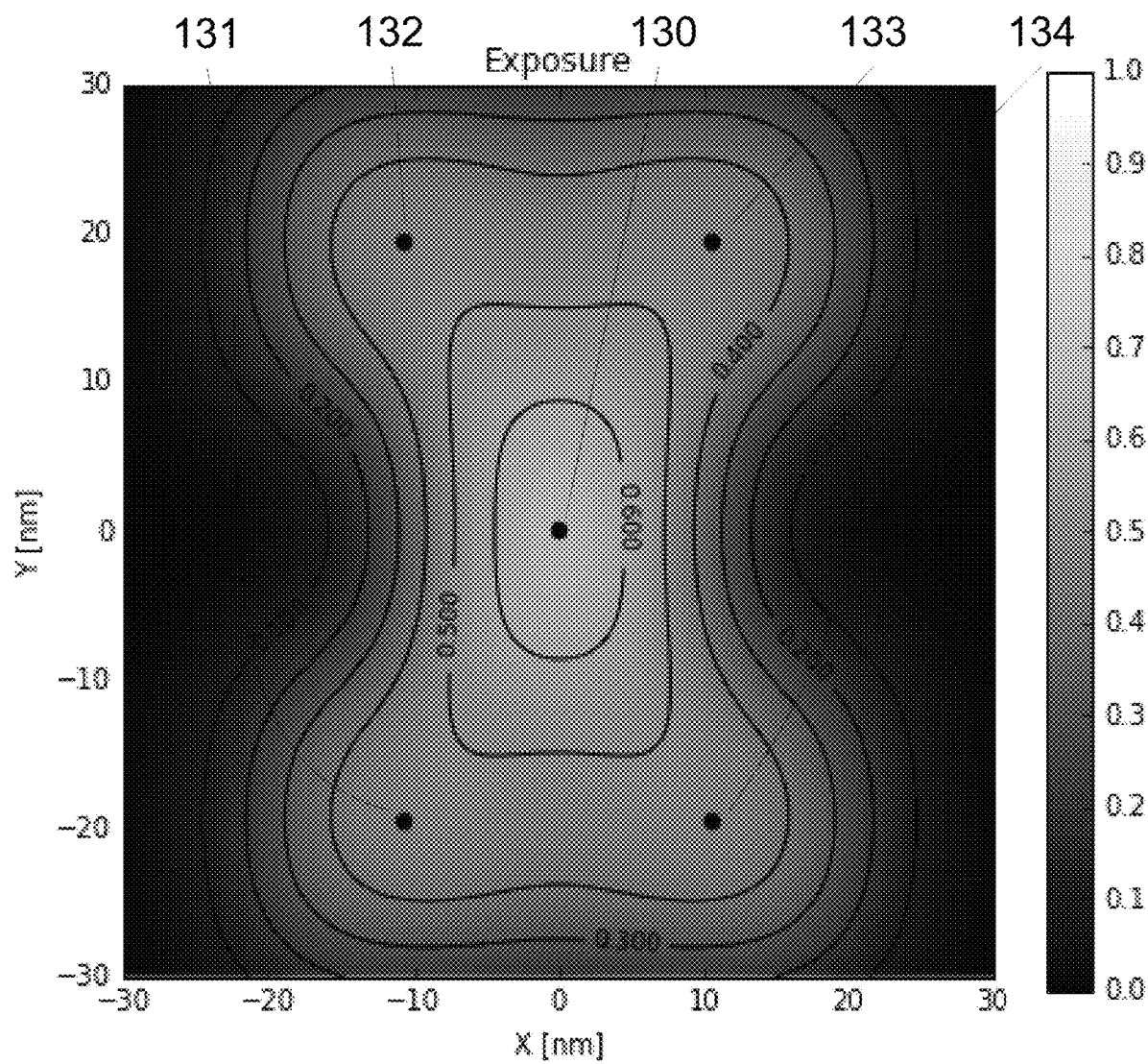
Figure 14C:
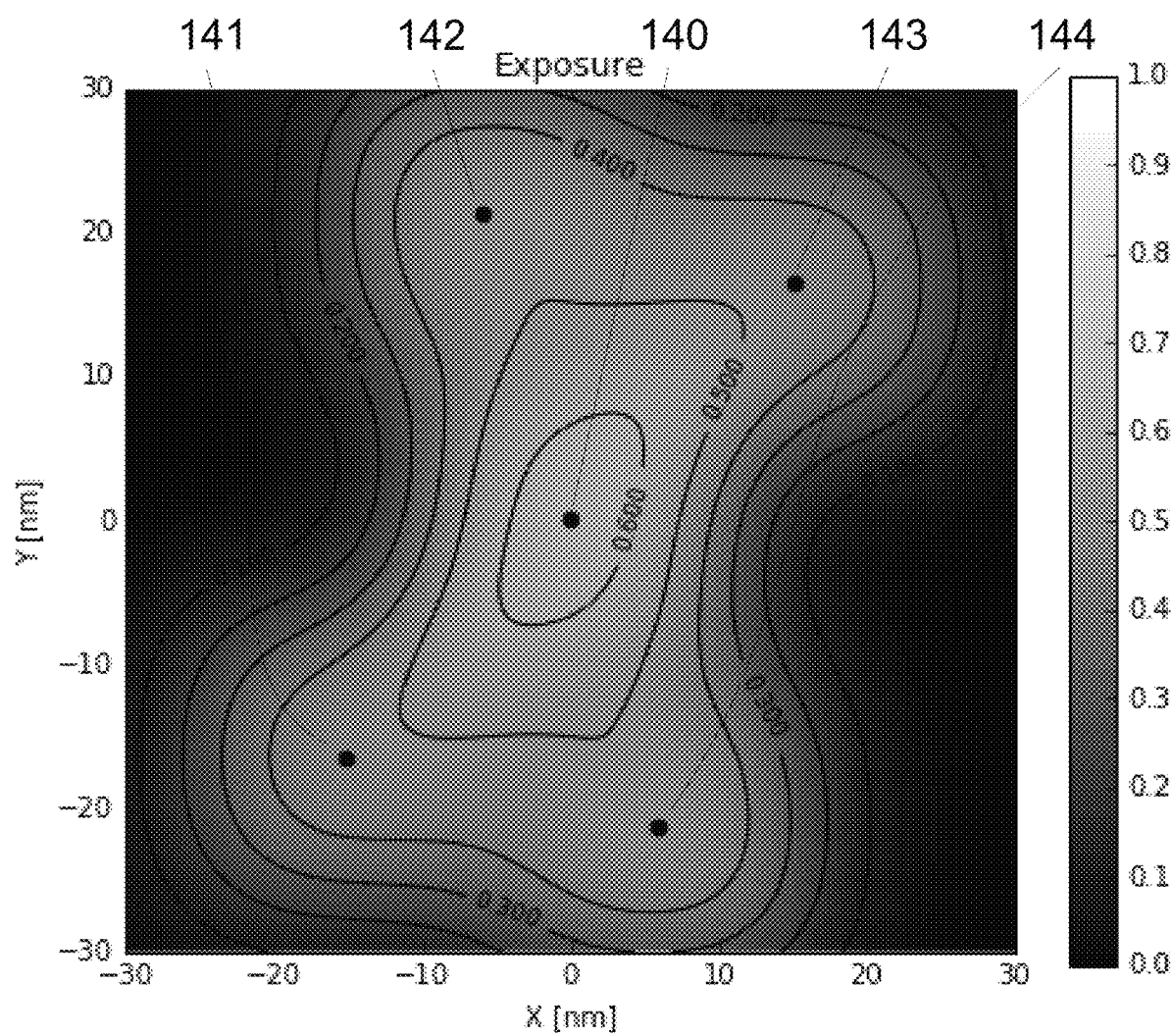
Figure 14D:
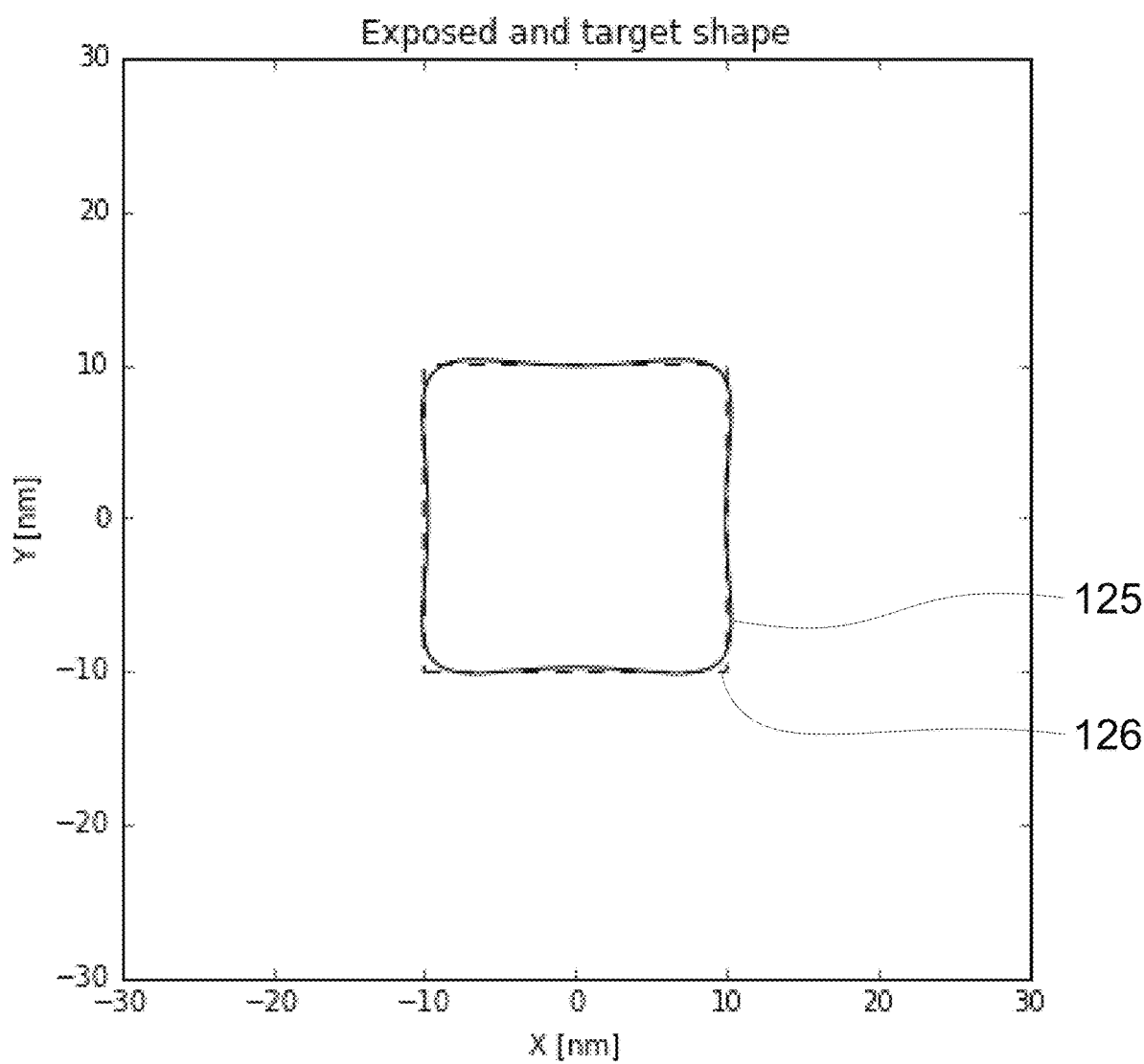
Figure 14E:
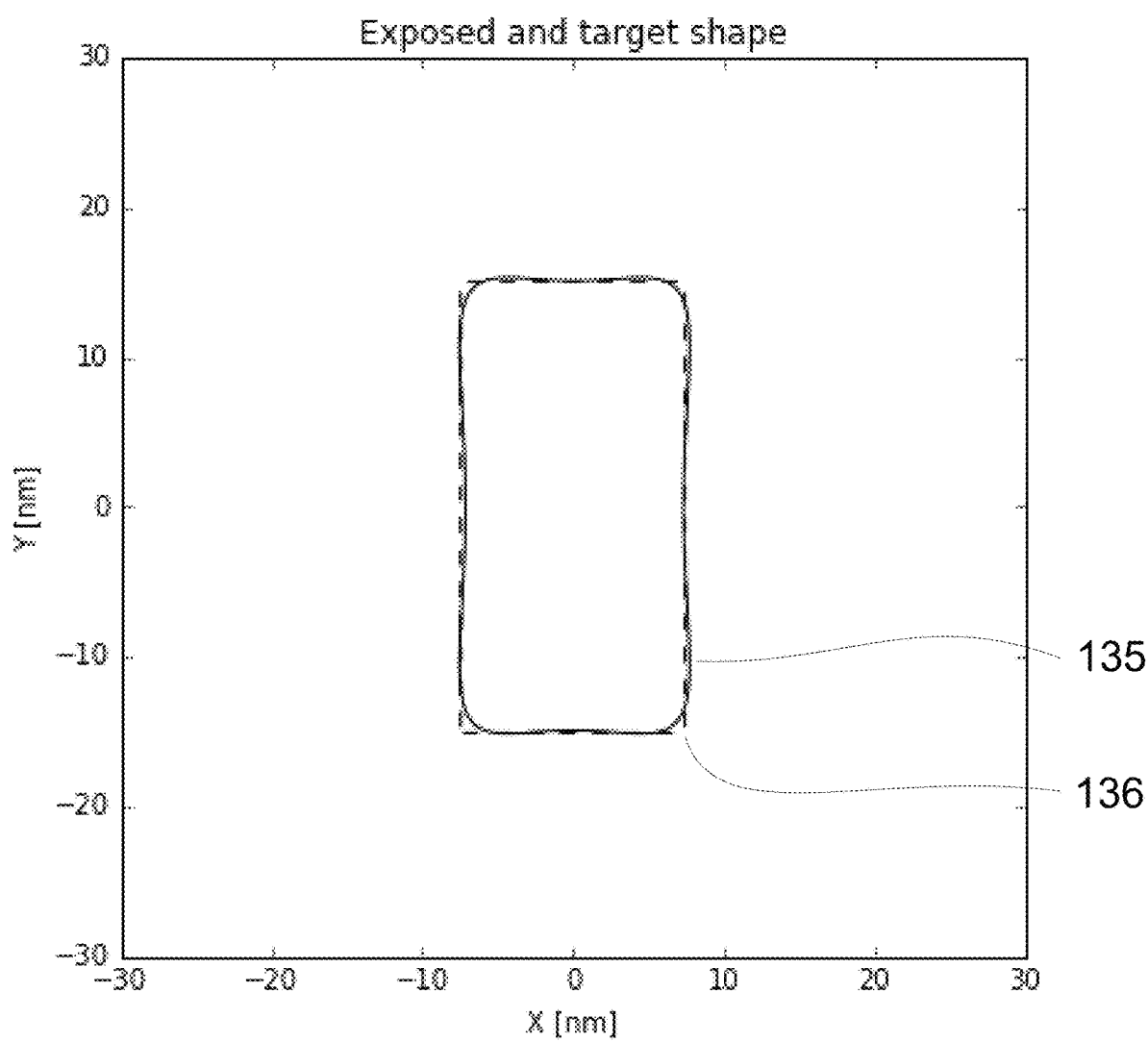
Figure 14F:
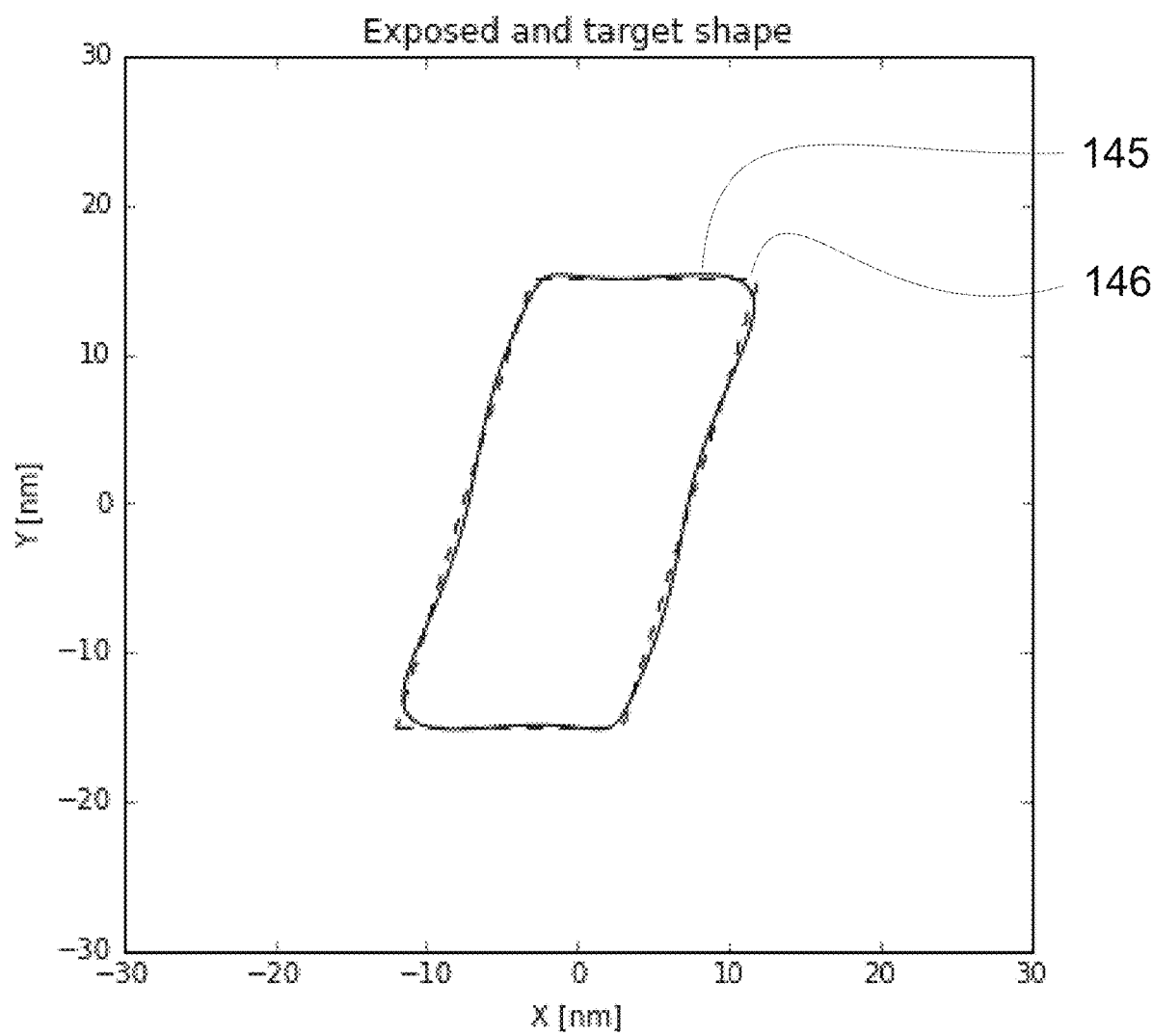
Figure 14G:
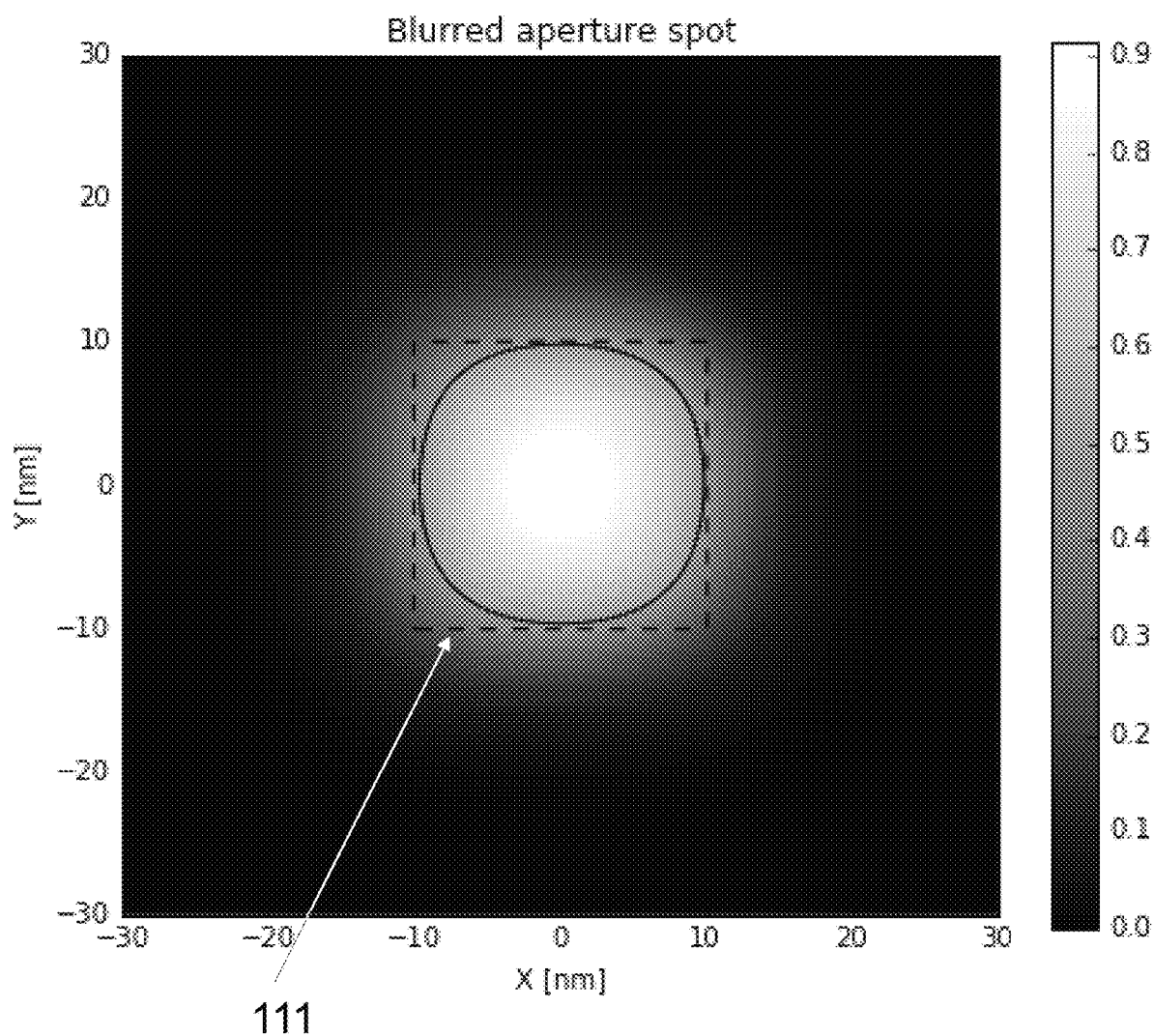
Figure 14H:
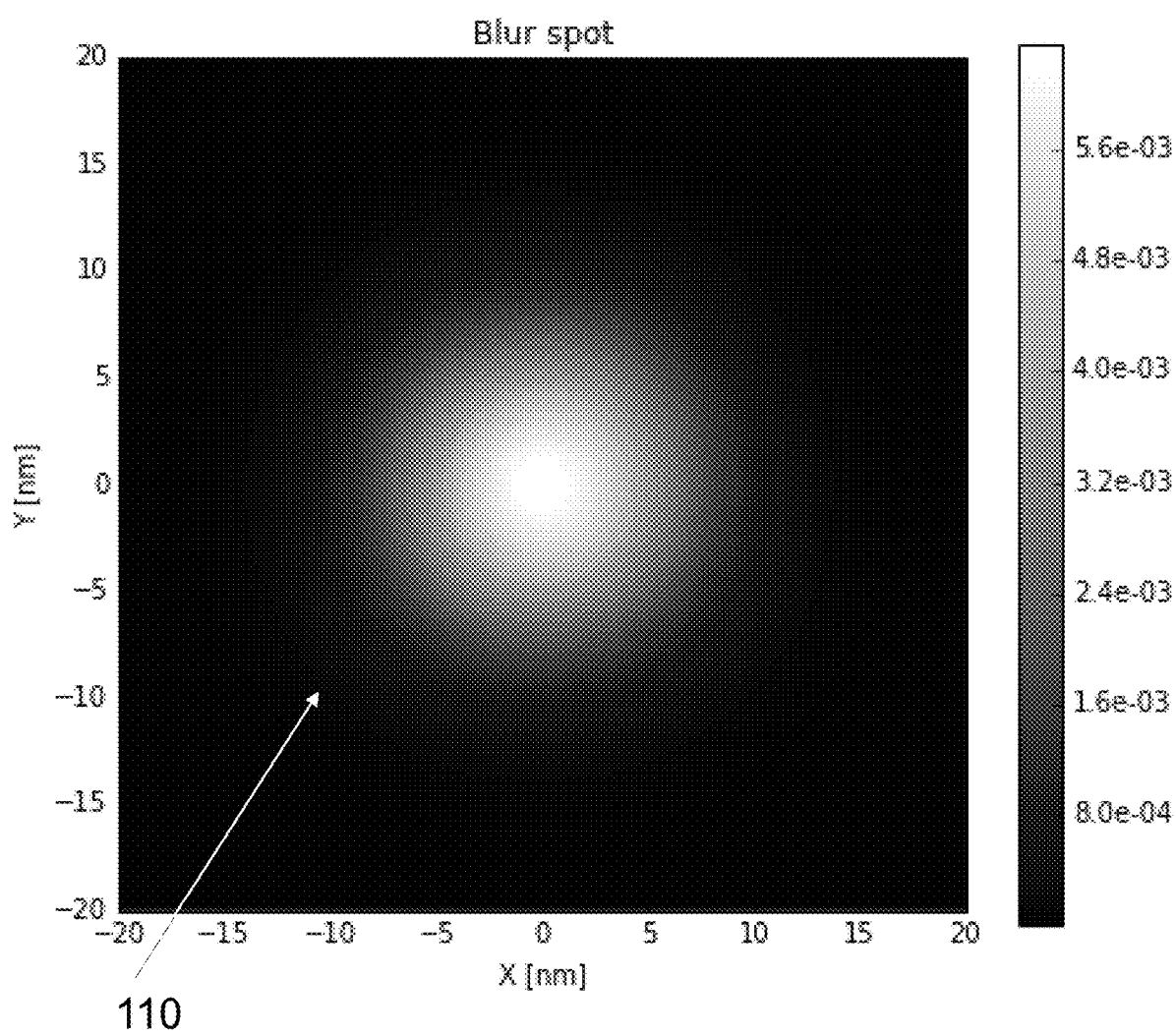

According to a further development of the invention, the exposure positions within the patches need not be arranged in a regular rectangular or square grid (as restricted to the limited area of a patch), but may be located according to a general set of positions. In some cases, it may be desirable to deviate from the regular grid structure to some extent, in other cases the grid structure may be replaced entirely by a random-like set of positions. The exposure positions can, for instance, be optimized to write a certain via/cut shape (that may differ from the aperture image shape). FIG. 14 shows examples of suitable choices of various exposure position sets optimized to generate different target shapes. Specifically, the frames of FIGS. 14A-C (left-hand column) show a respective set of five exposure positions 120-124, 130-134, and 140-144, respectively (dots in the left column), as well as dose profiles obtained by a simulation calculation as indicated by the shading in each frame. To obtain the dose profiles, copies of the blurred aperture image 111 (FIG. 14G) for a single exposure position were superimposed on a 0.1 nm grid (to simulate an exposure process) at exposure positions, which, along with their assigned doses, were chosen to optimally reproduce the target shape. The blurred aperture image 111 of FIG. 14G is obtained by convolution with a Gaussian point spread function 110 shown in FIG. 14H, in order to model the imaging function of the lithography apparatus. The frames of FIGS. 14D-F (right-hand column) indicate the dose-to-clear contours 125, 135, 145 as obtained at the 0.5 level of the dose profile; these represent very good approximations to an ideal target shapes as indicated with the dashed box lines 126, 136, 146. The parallelogram-shaped vias/cuts of FIGS. 14E+F may be used to cut lines diagonally. In each of FIGS. 14A-C, the central position 120, 130, 140 coincides with the center of the ideal target shape; the four outer shape-correction exposure positions 121-124, 131-134, and 141-144 (and the doses assigned thereto) were obtained by varying position and dose so as to maximize the fidelity of the simulated target shape 125, 135, 145 with respect to the ideal target shape 126, 136, 146; this was made by taking symmetries of aperture spot and the ideal target shape 126, 136, 146 into account.

Figure 16:
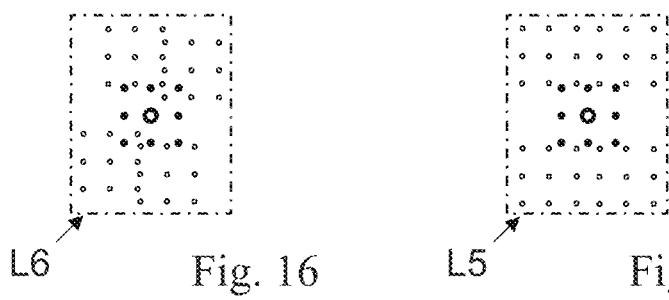
FIG. 16 provides an illustration of a patch according to yet another embodiment corresponding to the exposure position set of FIGS. 14C & F.
Figure 15:
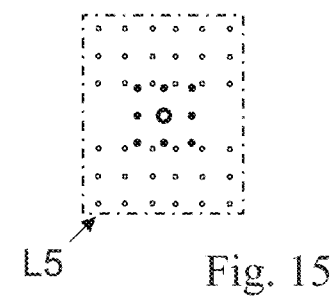
FIG. 15 provides an illustration of a patch according to another embodiment corresponding to the exposure position set of FIGS. 14B & E.

FIG. 15 shows a patch L5 comprising a number of pixel locations according to a further embodiment, adapted to emulate the rectangular structure shown in FIGS. 13B+E. In a similar manner, FIG. 16 shows another patch L6 comprising a number of pixel locations according to another embodiment, adapted to emulate the parallelogram-shaped structure shown in FIGS. 13C+F. Both examples are intended for writing vias/cuts of 15 nm×30 nm size with pitch CPx=CPy=80 nm and aperture image pitches cX=cY=160 nm. For each patch, the centerpoint positions (indicated by bold symbols) and shape-correction positions (thin symbols) are arranged in respective square grids (around their respective nominal position) with ex=ey=10 nm, Gx=Gy=20 nm. This arrangement will allow the correction of position deviations by dose variations. As before, the maximal correctable position deviation is e=Gx/2=Gy/2=10 nm in both coordinate directions. The individual patches L5, L6 may be arranged in n exposure cell analogous to that of FIG. 12A, but with the distance along the Y direction suitable increased (for instance, doubled). Thus, an exposure cell may include four patches, corresponding to 180 pixel positions, as compared to $(No)^2=256$ positions for a "full double-grid" state of the art with N=8 and o=2, despite allowing for highly increased accurate shape representation.

Doctrine of Equivalents

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A method for irradiating a target with a beam of energetic radiation composed of electrically charged particles, wherein the target comprises an exposure region where an exposure by said beam is to be performed, the method comprising the steps of:

defining a multitude of pattern pixels located at fixed pixel locations within said exposure region, dividing said exposure region into a number of stripes of predefined width, defining, for each stripe, a multitude of exposure positions on the target, each exposure position representing the location of one of a multitude of exposure spots, the exposure spots having uniform size and shape and each exposure spot covering at least one pattern pixel, providing a pattern definition device having a plurality of apertures transparent to said radiation, illuminating said pattern definition device by means of an illuminating wide beam, which traverses the pattern definition device through said apertures thus forming a patterned beam consisting of a corresponding plurality of beamlets, forming said patterned beam into a pattern image on the location of the target, said pattern image comprising the images of at least part of the plurality of apertures, which images sequentially expose the exposure spots in accordance with a desired pattern, and generating a relative movement between said target and the pattern definition device producing a movement of said pattern image on the target according to a path corresponding to said stripes, wherein the width of the pattern image, taken across the direction of movement is at least the width of the respective stripes, wherein defining a multitude of exposure positions is performed with regard to a number of mutually separate cluster areas defined at respective fixed locations on the target, and comprises:

defining locations of the exposure positions such that each exposure position is within one of the cluster areas, each of said cluster areas comprising a number of exposure positions arranged such that each exposure position is within a given neighboring distance to at least one exposure position of the same cluster area, wherein said neighboring distance is smaller than a size of the images of apertures generated on the target, wherein the cluster areas are separated from each other by spaces free of exposure positions, said spaces having a width, which is at least the double of said neighboring distance along at least one direction within the exposure region.

2. The method of claim 1, wherein a number of stripes is written, each stripe being associated with a subset of grid locations of exposure positions for the cluster areas within the respective stripe, the subsets of different stripes being mutually different and, when taken together, combining to a complete cover of the exposure positions in the cluster areas.

3. The method of claim 2, wherein each of the cluster areas comprises at least two sets of exposure positions associated with a respective subset of grid locations, and each of said sets of exposure positions comprises a minimal number of exposure positions, said minimal number being valid for all cluster areas, said minimal number being four, five or more.

4. The method of claim 3, wherein for each of said sets of exposure positions, the spatial arrangement of exposure positions of different cluster areas, but associated with the same subset of grid locations, are the same when seen relative to a center position of the respective cluster area.

5. The method of claim 1, wherein each of the cluster areas comprises a number of exposure positions, said number of exposure positions being equal or greater than a minimal number common to all cluster areas, said minimal number being four, five or more.

6. The method of claim 1, wherein the size of each cluster area is larger by at least a factor of 3/2 than the size of the image of apertures as imaged onto the target, with regard to both a direction parallel to said direction of movement and a direction transversal thereto.

7. The method of claim 1, wherein the arrangements of the exposure positions within the cluster areas repeat from one cluster area to the next.

8. The method of claim 1, wherein those locations of exposure positions which are exposed simultaneously on the target are arranged according to a two-dimensional grid which directly corresponds to a projected image of a two-dimensional regular arrangement of the apertures in the pattern definition device.

9. The method of claim 8, wherein for each of the cluster areas, and when seen relative to a center position of the respective cluster area, the spatial arrangement of exposure positions is the same for the different cluster areas.

10. The method of claim 9, wherein the set of center positions of the cluster areas is a union of several placement grids as represented by positions of images of apertures on the target.

11. The method of claim 9, wherein the cluster areas are located at predefined positions, said predefined positions forming a regular arrangement on the target in said exposure region, which regular arrangement corresponds to a superset of said two-dimensional grid.

12. The method of claim 2, wherein each stripe contains at least two rows of cluster areas arranged along said main direction.

13. The method of claim 1, wherein within a cluster area the exposure positions are arranged along a regular grid.

14. The method of claim 1, wherein within a cluster area, the exposure positions are arranged to each other at an oblique angle with respect to said direction of movement.

15. The method of claim 1, wherein within a cluster area the set of exposure positions includes a group of exposure positions which are arranged in a defined spatial arrangement, said defined spatial arrangement being designed to produce a predetermined shape each of the group of exposure positions is exposed.

16. The method of claim 1, wherein the cluster areas are arranged along a number of lines, said lines being located at uniform offsets.

17. The method of claim 16, wherein the lines of said number of lines correspond to lines of a line pattern which is pre-formed on the target, and the cluster areas are arranged along said lines at regular intervals.

18. The method of claim 1, wherein said neighboring distance is not greater than the nominal size of images of apertures.

19. The method of claim 1, wherein the exposure positions are selectively exposed at respective exposure doses according to an actual pattern of pattern pixels to be exposed, wherein the position of the exposure positions is independent of the actual pattern.

20. The method of claim 1, wherein uniformly timed exposure steps are used for exposing respective pattern pixels in exposure positions on the target, and during said exposure steps the location of the pattern image is moved along with the target at least with respect to the relative movement along the main direction, and between exposure steps the location of the pattern image is changed with respect to the target, generally compensating the movement of the location of the pattern image with regard to the location of the pattern definition device, wherein the duration of said exposure steps corresponds to a uniform distance of advance along the main direction, said distance of advance being greater than the size of an aperture image within the same partial grid along the main direction.

21. The method of claim 1, wherein the cluster areas are separated from each other by spaces free of exposure positions, along both a direction parallel to said direction of movement and a direction transversal thereto.

22. The method of claim 6, wherein said factor is at least double the size of the image of apertures as imaged onto the target.

* * * * *